(12) United States Patent
Satoh et al.

(10) Patent No.: US 6,310,374 B1
(45) Date of Patent: Oct. 30, 2001

(54) NONVOLATILE SEMICONDUCTOR MEMORY DEVICE HAVING EXTRACTING ELECTRODE

(75) Inventors: Shinji Satoh; Riichiro Shirota, both of Fujisawa; Seiichi Aritome, Yokohama, all of (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/217,089

(22) Filed: Dec. 21, 1998

(30) Foreign Application Priority Data

Dec. 25, 1997 (JP) .................................... 9-356461

(51) Int. Cl.[7] ...................... H01L 27/108; H01L 29/76; H01L 29/94; H01L 31/119
(52) U.S. Cl. ........................ 257/298; 257/315; 257/316
(58) Field of Search ............................ 257/315, 316, 257/319, 320, 326, 296, 298, 300; 365/185.01, 185.07

(56) References Cited

U.S. PATENT DOCUMENTS 5,677,556 * 10/1997 Endoh .................. 257/316
5,698,879 * 12/1997 Aritome et al. ............. 257/315
5,900,656 * 5/1999 Park ...................... 257/295

OTHER PUBLICATIONS

Choi, J.D. "A Novel Booster Plate Technology in High Density NAND Flash Memories for Voltage Scaling–Down and Zero Program Disturbance," 1996 Symposium on VLSI Technology Digest of Technical Papers, 1996 IEEE, pp. 238–239.

* cited by examiner

Primary Examiner—Olik Chaudhuri
Assistant Examiner—Hoai Pham
(74) Attorney, Agent, or Firm—Hogan & Hartson, L.L.P.

(57) ABSTRACT

This invention is a nonvolatile semiconductor memory device including an electrically rewritable memory cell having a gate, source, drain, and charge storage layer, an extracting electrode electrically connected to at least one of the source and drain of the memory cell, and a counter electrode essentially capacitively coupled with the extracting electrode.

22 Claims, 17 Drawing Sheets

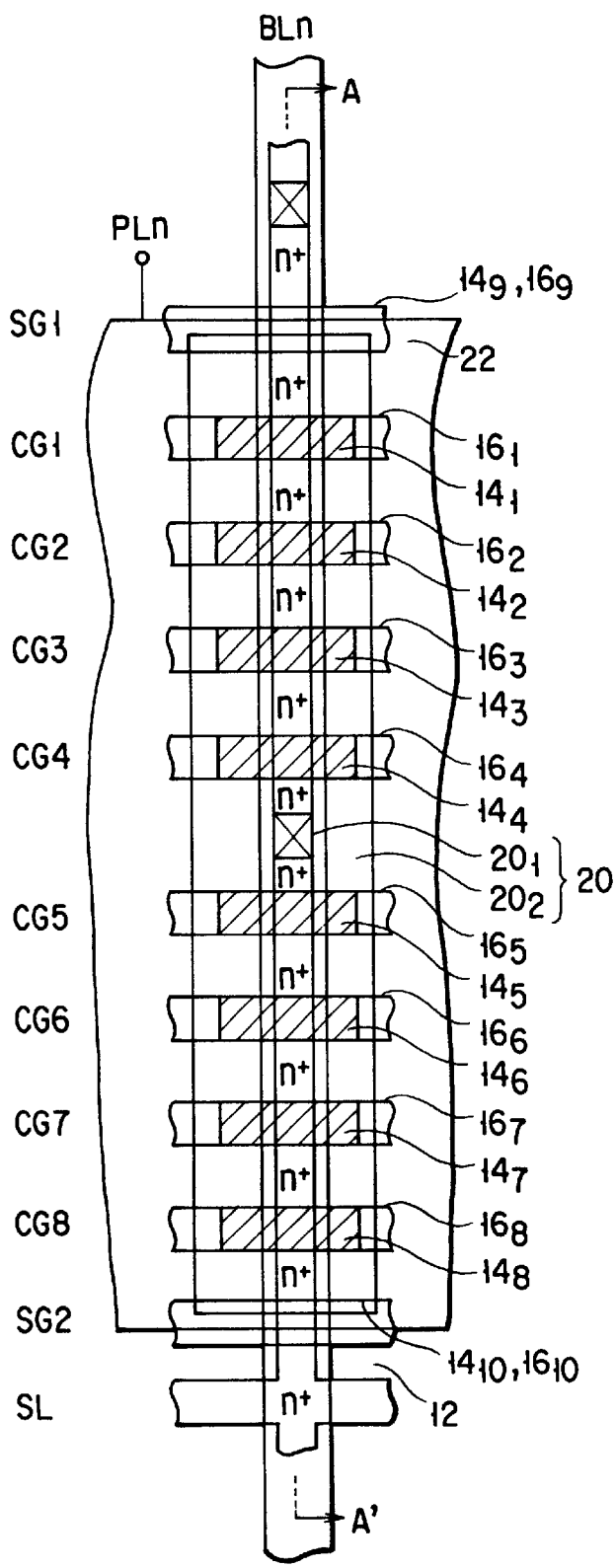
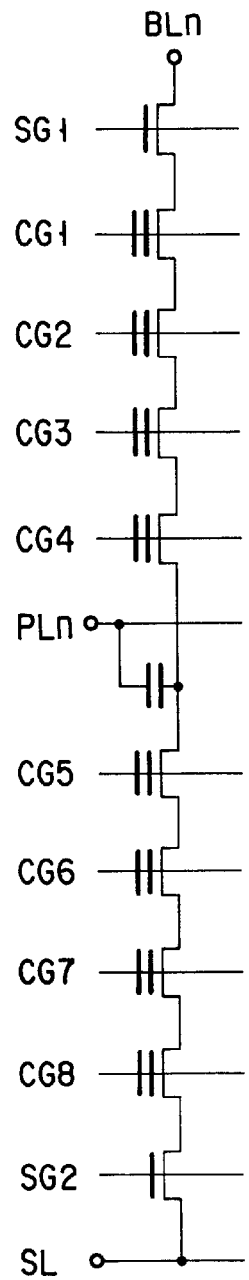
FIG. 7A
FIG. 7B

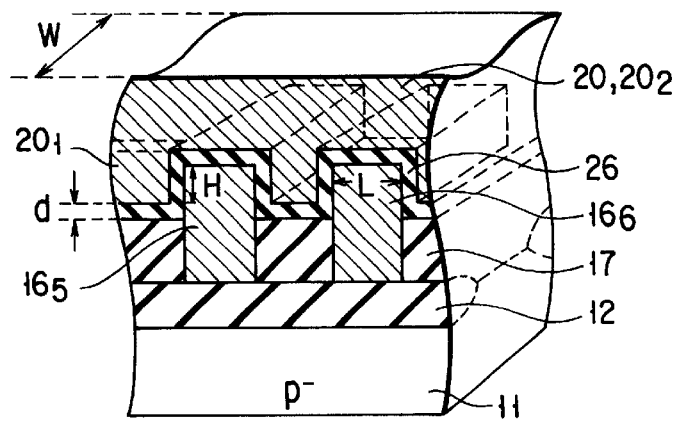
FIG. 22
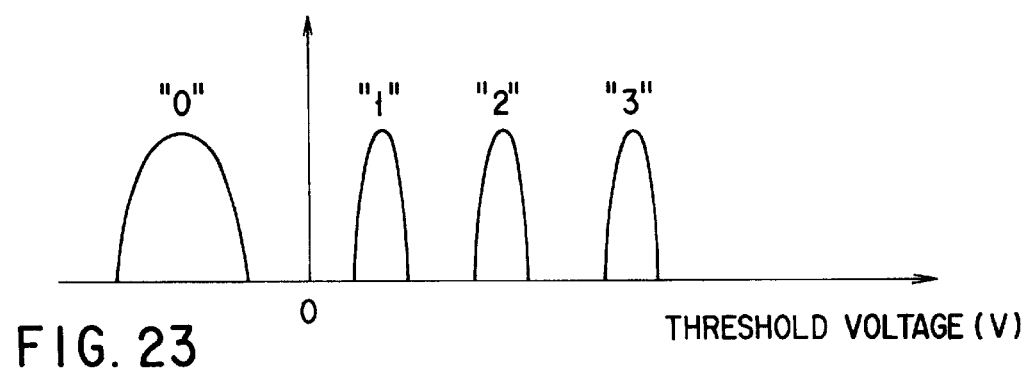
FIG. 23
| | WRITE | ERASE | READ |
|---|---|---|---|
| BL ("0"DATA) | 0 | FLOATING | "H" |
| BL ("1"DATA) | Vcc | FLOATING | "L" |
| SL | Vcc | FLOATING | 0 |
| PL | vpp,vpl | 0 | Vcc |
| WL (SELECTION) | vpp | 0 | 0 |
| WL (NON-SELECTION) | vpass | FLOATING | Vcc |
| SG1 | Vcc | FLOATING | Vcc |
| SG2 | 0 | FLOATING | Vcc |
| well | 0 | vee | 0 |
FIG. 24

|  | WRITE | ERASE | READ |
|---|---|---|---|
| BL ("0" DATA) | 0 | FLOATING | "H" |
| BL ("1" DATA) | Vcc | FLOATING | "L" |
| SL | Vcc | FLOATING | 0 |
| WL (SELECTION) | Vpp | 0 | 0 |
| WL (NON-SELECTION) | Vpass | FLOATING | Vcc |
| SG1 | Vcc | FLOATING | Vcc |
| SG2 | 0 | FLOATING | Vcc |
| Well | 0 | Vee | 0 |

FIG. 25

NONVOLATILE SEMICONDUCTOR MEMORY DEVICE HAVING EXTRACTING ELECTRODE

BACKGROUND OF THE INVENTION

The present invention relates to a nonvolatile semiconductor memory device and, more particularly, to a nonvolatile semiconductor memory device which writes data by the self-boost write method.

Recently, a demand for nonvolatile semiconductor memory device has greatly increased because these memories have the advantages that, e.g., data is not erased even when the power supply is turned off. In a flash memory which is an electrically simultaneously erasable nonvolatile semiconductor memory device, the memory cell can be formed by one transistor unlike in a two-transistor type byte nonvolatile semiconductor memory device. As a consequence, the memory cell shrinks, so the possibility of use of this flash memory as, e.g., a substitute for a large-capacity magnetic disk and the like is being explored.

Among other flash memories, a NAND EEPROM is known as a memory particularly advantageous to increase the degree of integration. This memory has the following structure. That is, a plurality of memory cells are arrayed in the column direction, and the source and drain of each pair of adjacent cells are connected. This connection forms a unit cell group (NAND cell) in which a plurality of memory cells are connected in series. This unit cell group is connected as a unit to a bit line.

A memory cell has a stacked gate structure in which a floating gate which commonly functions as a charge storage layer and a control gate electrode are stacked. Such memory cells are integrated in a matrix manner in a p-type well which is formed in a p-type substrate or an n-type substrate. The drain side of the NAND cell is connected to a bit line via a selector gate. The source side of the NAND cell is connected to a source line (reference potential line) via a selector gate. The control gate of each memory cell is connected to a word line extending in the row direction.

Data is written in or erased from the NAND cell by injecting or releasing electrons into or from the floating gate of a memory cell. Data erase is performed as follows. For example, in a whole memory cell array, all word lines are set to 0V, and an erase voltage Vee of about 20V is applied to the substrate or well, thereby causing all memory cells to release electric charge from their floating gates to the substrate. Consequently, all memory cells are erased to a "1" data state in which the threshold value is negative. If a plurality of memory cell array blocks are present, data erase is sometimes performed in units of blocks. If this is the case, selected blocks are processed under the above conditions, and all word lines float in non-selected blocks.

Data write is performed in the following manner. A write voltage Vpp of about 20V is applied to a selected word line to which a memory cell in which data is to be written is connected. An intermediate voltage Vpass is applied to other non-selected word lines in the NAND cell. Also, the channel potential of the memory cell connected to the selected word line is controlled in accordance with whether the write data is "0" or "1". That is, if the write data is "0", 0V of the bit line is transferred to the channel of the memory cell to inject electrons into the floating gate by a tunnel current. Accordingly, the threshold value of the memory cell becomes positive. On the other hand, if the write data is "1", the channel potential of the memory cell is set through the bit line to an intermediate potential by which no tunnel injection takes place. Consequently, the threshold value of the memory cell is kept low and negative.

Data read is performed by applying 0V to a selected word line and an intermediate voltage by which a memory cell is turned on to the rest of word lines in the NAND cell regardless of whether the data is "0" or "1", and detecting through the bit line whether the NAND cell is turned on.

In writing data into a NAND EEPROM as described above, if low-voltage driving is realized a column peripheral circuit connected to a bit line can be constructed by Vcc transistors. This decreases the area of this peripheral circuit. In consideration of this advantage, the self-boost write method in which only the channel potential of a memory cell in which "1" data is to be written is sufficiently raised by using capacitive coupling has been proposed and put into practical use. A write performed by this self-boost write method will be described below.

FIG. 1 is an equivalent circuit diagram of a memory cell unit of a conventional NAND EEPROM. Reference symbols BL, SG, CG, and SL denote a bit line, selector gate line, word line, and source line, respectively.

If data write simultaneously performed for a plurality of memory cells in the row direction is a common write, data is sequentially written from the memory cell farthest from the bit line BL. If the data write is a random write, data is written in an arbitrary memory cell between the bit line BL and the source line SL.

In either case, 0V is applied to a selector gate line SG2 near the source line SL to switch off a selector gate transistor. A bit line BL to which a NAND cell having a memory cell in which "0" data is to be written is connected is set to a write selection potential of 0V. A bit line BL to which a NAND cell having a memory cell in which "1" data is to be written is connected is set to a write non-selection potential, more specifically, a potential higher than that of a selector gate line SG1 near the bit line BL or a potential which is lower than that of the selector gate line SG1 but by which a selector gate transistor is cut off. Note that a predetermined positive voltage is supplied to the source line SL to sufficiently cut off a selector gate transistor near the source line SL.

When the write voltage Vpp or the intermediate voltage Vpass is applied to a word line CG of a selected block in this state, memory cells are turned on when the voltage pulse rises. As a consequence, 0V is transferred to the channel of the NAND cell connected to the bit line BL set at 0V as the write selection potential. Accordingly, electrons are injected by a tunnel current into the floating gate of a memory cell connected to a selected word line, and "0" data is written in the cell.

In the NAND cell connected to the bit line BL set at the write non-selection potential, an initial potential obtained by subtracting the threshold value of the selector gate transistor from the potential of the bit line BL is transferred to the channel of the NAND cell from the bit line BL via the selector gate transistor. After that, the selector gate transistor near the bit line is cut off to float the channel of the NAND cell. Therefore, when the write voltage Vpp or the intermediate voltage Vpass is applied to the word line CG of the selected block, the capacitive coupling between these word line and NAND cell channel boots the channel potential of the NAND cell from the initial potential as described above. Consequently, the floating gate of a memory cell connected to a selected word line is also set to a write inhibit voltage by which no tunnel injection occurs. That is, "1" data by which the threshold value of the memory cell is kept negative is written.

A write inhibit voltage actually obtained by the self-boost write method is calculated below by taking account of the write timings in this method. Assume that the potential of the bit line BL is set to 0V or a power-supply voltage Vcc (e.g., 3.3V) in accordance with write data, Vcc is supplied to the source line SL and the selector gate line SG1 near the bit line BL, and 0V is supplied to the selector gate line SG2 near the source line SL. If the write voltage Vpp (e.g., 20V) and the intermediate voltage Vpass (e.g., 10V) are applied to a selected word line CG and a non-selected word line, respectively, of a selected block, the floating channel of the NAND cell is booted to a write inhibit voltage Vch. This write inhibit voltage Vch is represented by $$Vch=Vsg-Vsgth(Vchinit)+Cr1(Vpass-Vpassth(Vchinit))+Cr2(Vpp-Vpassth(Vchinit))$$

(where Vsg is the potential of the selector gate line SG1 near the bit line BL, Vsgth (Vchinit) is the threshold value of a selector gate transistor near the bit line BL when the initial channel potential of the NAND cell is Vchinit, Cr1 and Cr2 are the channel boot ratios, Cr1 being the ratio of the total channel capacitance to the gate-channel capacitance of all memory cells connected to non-selected word lines, and Cr2 being the ratio of the total channel capacitance to the gate-channel capacitance of a memory cell connected to a selected word line, and Vpassth (Vchinit) is the gate potential necessary to turn on a memory cell when the NAND cell channel potential is Vchinit.)

The above equation shows that the conditions by which memory cells and selector gate transistors are formed have large influence on the write inhibit voltage Vch in the self-boost write method. That is, the channel initial potential Vchinit of the NAND cell and the channel boot ratios Cr1 and Cr2 in the above equation largely depend upon the concentration profile of the source drain diffusion layer of the memory cell or selector gate transistor, the impurity concentration profile of the substrate or well, and the profile of ion implantation performed for the channels of the memory cell and selector gate transistor. Therefore, if these profiles change, no sufficient write inhibit voltage Vch can be obtained in some cases in a memory cell in which "1" data is to be written. Consequently, the threshold value of the memory cell in which "1" data is to be written changes to lead to write error.

As described above, the self-boost write method has the problem that variations in the various characteristics such as the impurity profiles of memory cells and selector gate transistors degrade the memory cell write error characteristics. To solve this problem, Symp. VLSI Technology Dig. Tec. Papers, June 1996, pp. 236–237 and pp. 238–239 has recently reported a technique which sufficiently raises the channel potential of a memory cell in which "1" data is to be written by using a conductor constructed of a booster plate electrode, thereby improving the memory cell write error characteristics.

FIG. 2 is a partially cutaway perspective view showing the arrangement of a NAND EEPROM having this booster plate electrode. As shown in FIG. 2, this NAND EEPROM is characterized in that a booster plate electrode 76 is formed via a plate oxide film 75 on a stacked gate structure obtained by forming a floating gate 72 and a control gate 74 on the surface of a substrate 70 via a gate insulating film 71 and an ONO film 73, respectively. Writes, erases, and reads are generally identical with those of the aforementioned NAND EEPROM except that the booster plate electrode 76 is set at the same write voltage Vpp as a selected word line when data is written and supplied with 0V when data is erased.

The reference cited above indicates that in this NAND EEPROM having the booster plate electrode, the write voltage Vpp and the intermediate voltage Vpass applied to selected and non-selected word lines of a selected block when data is written can be lowered to 13V and Vcc, respectively, for the reasons explained below. That is, since the booster plate electrode is capacitively coupled with the control gate via the plate oxide film, the essential capacitive coupling ratio during data write increases. Additionally, the booster plate electrode is also capacitively coupled with the source and drain of each memory cell in a NAND cell via the plate oxide film, so the floating channel potential of the NAND cell is booted by the booster plate electrode.

More specifically, a NAND EEPROM having a booster plate electrode uses the capacitive coupling between the control gate and booster plate electrode and the channel of a NAND cell and hence can raise the channel potential of a memory cell in which "1" data is to be written to a sufficiently high write inhibit voltage Vch. Accordingly, it is possible to suppress variations in the threshold value of a memory cell in which "1" data is to be written and avoid degradation of the memory cell write error characteristics in the self-boost write method. Also, when data write is performed a sufficiently high write inhibit voltage Vch can be obtained in a memory cell in which "1" data is to be written without excessively raising the intermediate voltage Vpass of a non-selected word line in a selected block. As a consequence, write error can also be effectively prevented in a memory cell connected to a non-selected word line near a NAND cell to the channel of which 0V is transferred from a bit line BL.

In this NAND EEPROM, however, to allow the booster plate electrode to is capacitively coupled with the source and drain of each memory cell in a NAND cell via the plate oxide film, a conductor layer serving as the booster plate electrode must be buried very close to the source and drain between adjacent memory cells each having a stacked gate structure after these memory cells are formed. If the spacing between a plurality of word lines in a NAND cell is narrowed to increase the aspect ratio of a memory cell having the stacked gate structure, it becomes very difficult to bury the conductor layer serving as the booster plate electrode between memory cells. This makes this NAND EEPROM very unsuitable to further shrinkage of the memory cell array.

In a NAND EEPROM having a booster plate electrode as described above, a sufficiently high write inhibit voltage Vch can be obtained, and the intermediate voltage Vpass of a non-selected word line in a selected block can be lowered. Accordingly, it is possible to wide the write error margin by eliminating degradation of the write error characteristics which is a problem in the self-boost write method. However, this NAND EEPROM is totally unsuitable to further shrinkage of the memory cell array.

BRIEF SUMMARY OF THE INVENTION

The present invention has been made in consideration of the above situation and has as its object to provide a nonvolatile semiconductor memory device capable of widening the write error margin and also suited to attain further shrinkage of a memory cell array.

To achieve the above object, the first aspect of the present invention is a nonvolatile semiconductor memory device comprising an electrically rewritable memory cell having a gate, source, drain, and charge storage layer, an extracting electrode electrically connected to at least one of the source and drain of the memory cell, and a counter electrode substantially capacitively coupled with the extracting electrode.

Also, the first aspect is a nonvolatile semiconductor memory device comprising a cell unit in which a plurality of electrically rewritable memory cells each having a gate, source, drain, and charge storage layer are connected to make adjacent memory cells share one of the sources and one of the drains an extracting electrode contacting at least one of source and drain in the cell unit, and a counter electrode substantially capacitively coupled with the extracting electrode.

Furthermore, the first aspect is a nonvolatile semiconductor memory device comprising a cell unit in which a plurality of electrically rewritable memory cells each having a gate, source, drain, and charge storage layer are connected to make adjacent memory cells share one of the sources and one of the drains, a bit line connected to one of a drain and source at one end of the cell unit, a source line connected to one of a source and drain at the other end of the cell unit, an extracting electrode contacting at least one of source and drain in the cell unit, and a counter electrode opposing the extracting electrode via an insulating film.

That is, the first aspect of the present invention is characterized by using the capacitive coupling between the extracting electrode electrically connected to the channel of a memory cell or of a cell unit including a plurality of memory cells and the counter electrode opposing this extracting electrode. In this first aspect, therefore, the extracting electrode need only contact at least one of source and drain of the memory cell or cell unit. This is very advantageous in shrinking a memory cell array in which a plurality of memory cells or cell units are integrated in a matrix manner, compared to a memory in which conductors are formed between and close to all adjacent ones of memory cells arrayed in the column direction.

In the first aspect of the present invention, one extracting electrode, for example, is formed in each cell unit, and the counter electrode is shared by a plurality of cell units sharing a word line in the row direction. When the extracting and counter electrodes are formed in this manner, the channel potential of each memory cell when a write is performed can be controlled in accordance with whether the write data is "0" or "1" simply by supplying a write voltage Vpp and an intermediate voltage Vpass to a selected word line and a non-selected word line, respectively, in a selected block and applying a high voltage to the counter electrode formed in each selected block.

Additionally, in the first aspect of the present invention, that contact portion of the extracting electrode which contacts the source and drain is preferably formed in self-alignment with the gate of each memory cell after the upper and side surfaces of the gate are covered with an insulating film having different etching selectivity from that of an insulating interlayer deposited on the memory cell. That is, when the contact portion of the extracting electrode is thus formed in self-alignment with the gate of each memory cell, the spacing between adjacent memory cells in the contact portion of the extracting electrode can be decreased. This allows further shrinkage of the memory cell array.

To achieve the above object, the second aspect of the present invention is a nonvolatile semiconductor memory device comprising an electrically rewritable memory cell having a gate, source, drain, and charge storage layer, and an extracting electrode electrically connected to at least one of the source and drain of the memory cell and substantially capacitively coupled with the gate.

Also, the second aspect is a nonvolatile semiconductor memory device comprising a cell unit in which a plurality of electrically rewritable memory cells each having a gate, source, drain, and charge storage layer are connected to make adjacent memory cells share the source and drain, and an extracting electrode contacting at least one source and one drain in the cell unit and substantially capacitively coupled with the gate.

Furthermore, the second aspect is a nonvolatile semiconductor memory device comprising a cell unit in which a plurality of electrically rewritable memory cells each having a gate, source, drain, and charge storage layer are connected to make adjacent memory cells share the source and drain, a bit line connected to one of a drain and source at one end of the cell unit, a source line connected to one of a source and drain at the other end of the cell unit, and an extracting electrode contacting at least one source and one drain in the cell unit and opposing the gate via an insulating film.

That is, the second aspect of the present invention is characterized by the use of the capacitive coupling between the extracting electrode electrically connected to the channel of a memory cell or of a cell unit including a plurality of memory cells and the gate of the memory cell. In this second aspect, therefore, as in the above first aspect, the extracting electrode need only contact at least one source and one drain of the memory cell or cell unit. This is very advantageous in shrinking a memory cell array in which a plurality of memory cells or cell units are integrated in a matrix manner, compared to a memory in which conductors are formed between and close to all adjacent ones of memory cells arranged in the column direction.

In the second aspect of the present invention, one extracting electrode, for example, is formed in each cell unit. When the extracting electrode is formed in this manner, the channel potential of each memory cell when a write is performed can be controlled in accordance with whether the write data is "0" or "1" simply by supplying a write voltage Vpp and an intermediate voltage Vpass to a selected word line and a non-selected word line, respectively, in a selected block.

Additionally, in the second aspect of the present invention, the extracting electrode is preferably opposed to the upper and side surfaces of the gates of all memory cells in the cell unit via an insulating film and substantially capacitively coupled with the side surfaces of each gate. This increases the capacitance between the extracting electrode and the gate of each memory cell and efficiently boots the channel potential of the memory cell to achieve a sufficiently high write inhibit voltage Vch. That is, to raise the boot efficiency for a floating channel, it is advantageous to construct the extracting electrode from a contact portion contacting the source and drain and an extracting portion extracted to a portion above a memory cell. This is exactly the same in the first aspect described above.

A nonvolatile semiconductor memory device of the present invention comprises a first selector gate transistor at one end of the cell unit connected to a bit line, and a second selector gate transistor at the other end connected to a source line. A memory cell connected to a selected word line is selected for data write when a first voltage which switches on the first selector gate transistor is applied to the bit line while the second selector gate transistor is kept non-conducting. A memory cell connected to a non-selected word line is not selected for data write when a second voltage which switches off the first selector gate transistor is applied to the bit line while the second selector gate transistor is kept OFF. This self-boost write method can be used in the present invention. Accordingly, the present invention is particularly effectively applicable to, e.g., a NAND EEPROM in which data is simultaneously written in memory cells sharing a word line.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7A is a plan view showing a NAND cell in a NAND EEPROM as one modification of the first embodiment;

FIG. 7B is a circuit diagram showing the NAND cell in the NAND EEPROM as one modification of the first embodiment;

FIG. 22 is a partially cutaway perspective view showing a contact portion of an extracting electrode shown in FIGS. 16 and 18A to 18C;

FIG. 23 is a graph showing the threshold value distribution of memory cells in a multi-valued EEPROM;

FIG. 24 is a view showing bias states when writes erases, and reads are performed; and FIG. 25 is a view showing bias states when writes, erases, and reads are performed.

DETAILED DESCRIPTION OF THE INVENTION

Embodiments of the present invention will be described in detail below with reference to the accompanying drawings.

Figure 1:
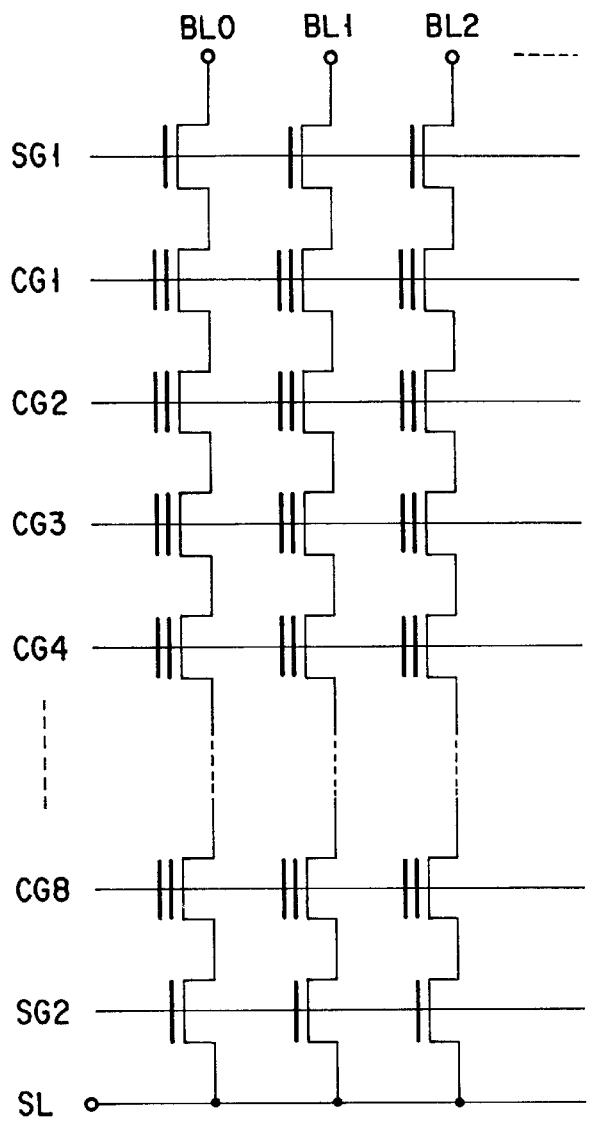
FIG. 1 is an equivalent circuit diagram of a memory cell unit in a conventional NAND EEPROM.
Figure 2:
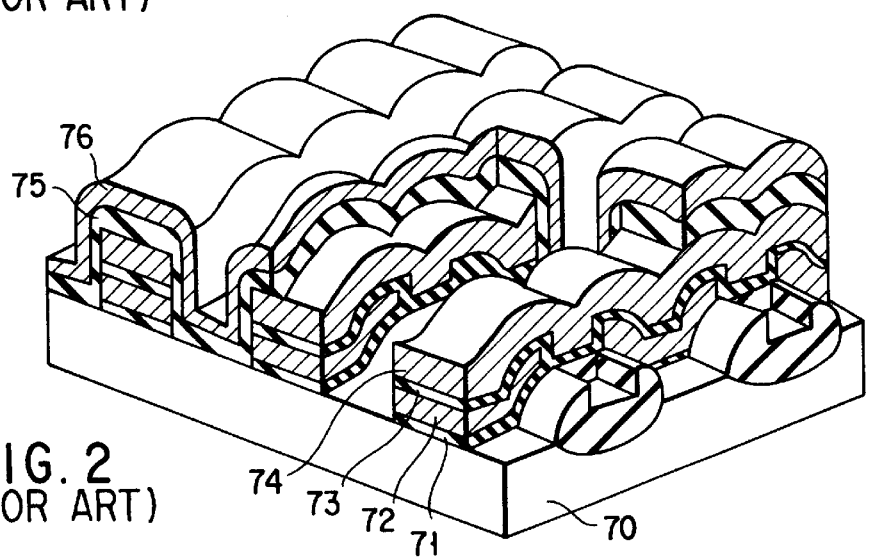
FIG. 2 is a partially cutaway perspective view showing the arrangement of a NAND EEPROM having a booster plate electrode.
Figure 3:
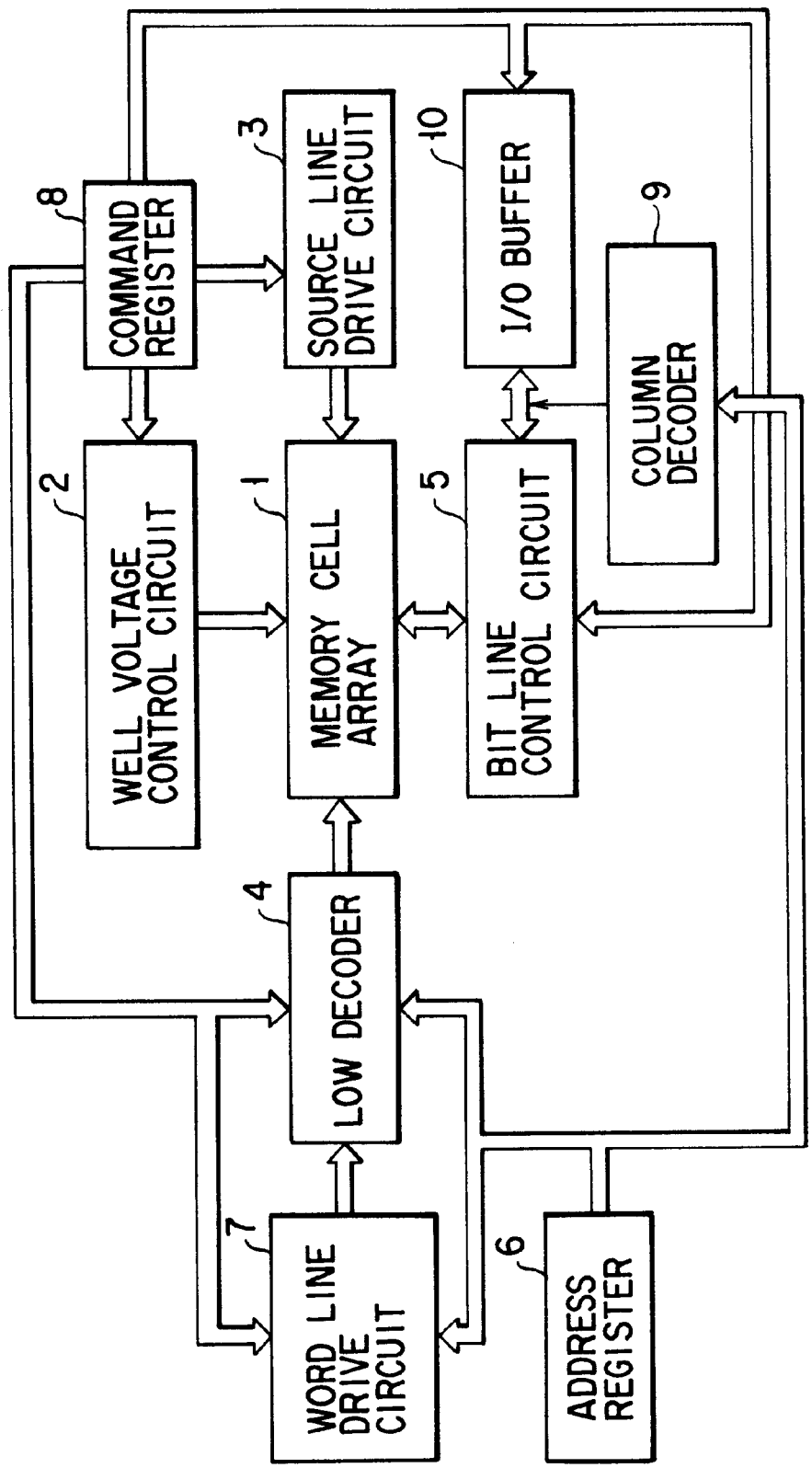
FIG. 3 is a schematic block diagram showing the overall arrangement of a nonvolatile semiconductor memory device of the present invention.

FIG. 3 is a schematic block diagram showing the overall arrangement of a nonvolatile semiconductor memory device of the present invention. As shown in FIG. 3, in this nonvolatile semiconductor memory device of the present invention, the output of an address register 6 is connected to the inputs of a word line drive circuit 7, a row decoder 4, and a column decoder 9. The output of the word line drive circuit 7 is connected to the input of the row decoder 4. The output of the column decoder 9 is connected to the inputs of a bit line control circuit 5 and an I/O buffer 10. The output of a command register 8 is connected to the inputs of the word line drive circuit 7, the row decoder 4, the I/O buffer 10, the bit line control circuit 5, a well voltage control circuit 2, and a source line drive circuit 3. The bit line control circuit 5 and the I/O buffer 10 are interconnected. The outputs of the row decoder 4, the well voltage control circuit 2, the source line drive circuit 3, and the bit line control circuit 5 are connected to inputs of a memory cell array 1. In this memory cell array 1, a plurality of NAND cells are integrated in a matrix manner.

In this arrangement, the memory cell array 1 is used to write, read out, or erase data. The bit line control circuit 5 latches data to be written in a memory cell of the memory cell array 1 when data write is performed, and senses and latches data to be read out to a bit line when data read is performed. When data write is performed, the I/O buffer 10 receives data from the outside of the nonvolatile semiconductor memory device and outputs the data to the bit line control circuit 5. The column decoder 9 interconnects a plurality of bit line control circuits 5 with one I/O buffer 10. The row decoder 4 selects a block corresponding to an input address from the memory cell array 1. The word line drive circuit 7 outputs a voltage to be supplied to the word lines of memory cells in the select ed block. The address register 6 latches the externally input address data and selects the word and bit lines of a specific selected memory cell via the column decoder 9, the row decoder 4, and the word line drive circuit 7. The well voltage control circuit 2 and the source line drive circuit 3 control the voltages of well and source of the memory cell array 1 in accordance with the operation mode such as data read or write. The command register 8 outputs a predetermined signal to each control circuit of the nonvolatile semiconductor memory device in accordance with the operation mode, i.e., read, write, or erase, which is determined by the input command.

Figure 4A:
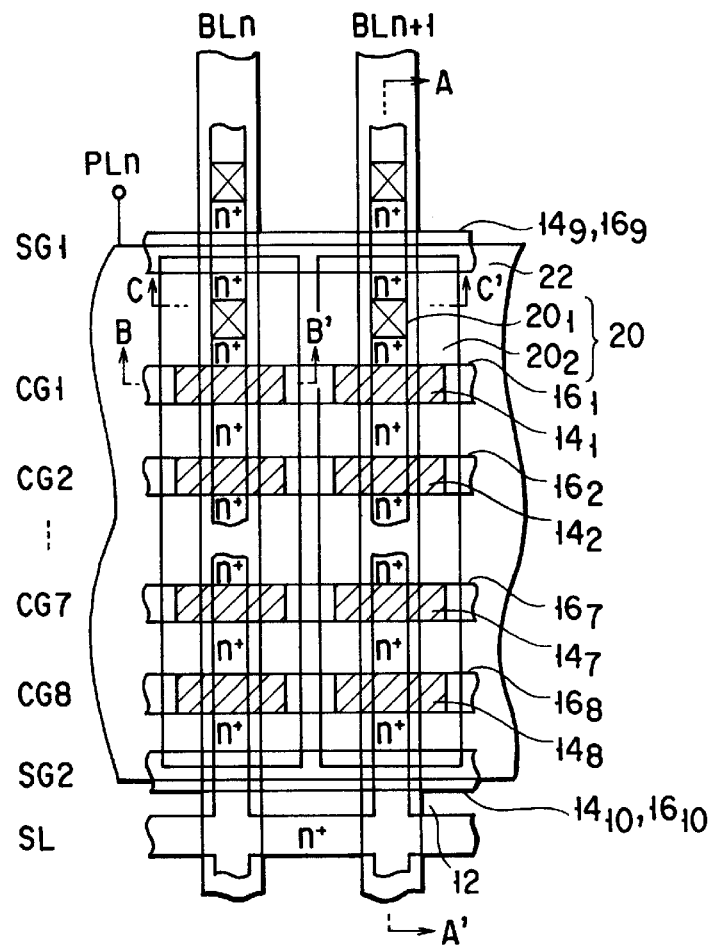
FIG. 4A is a plan view showing a NAND cell in a NAND EEPROM of the first embodiment.
Figure 4B:
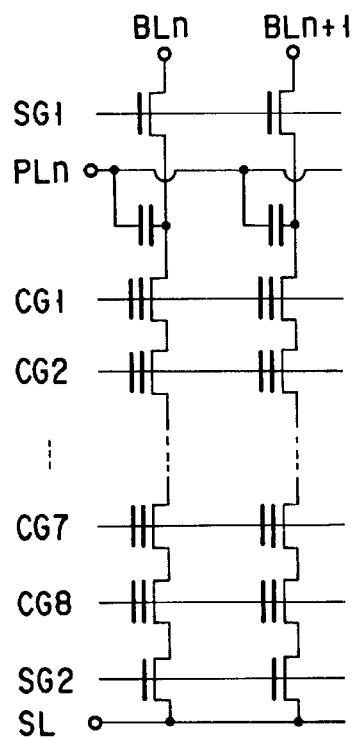
FIG. 4B is a circuit diagram showing the NAND cell in the NAND EEPROM of the first embodiment.
Figure 5A:
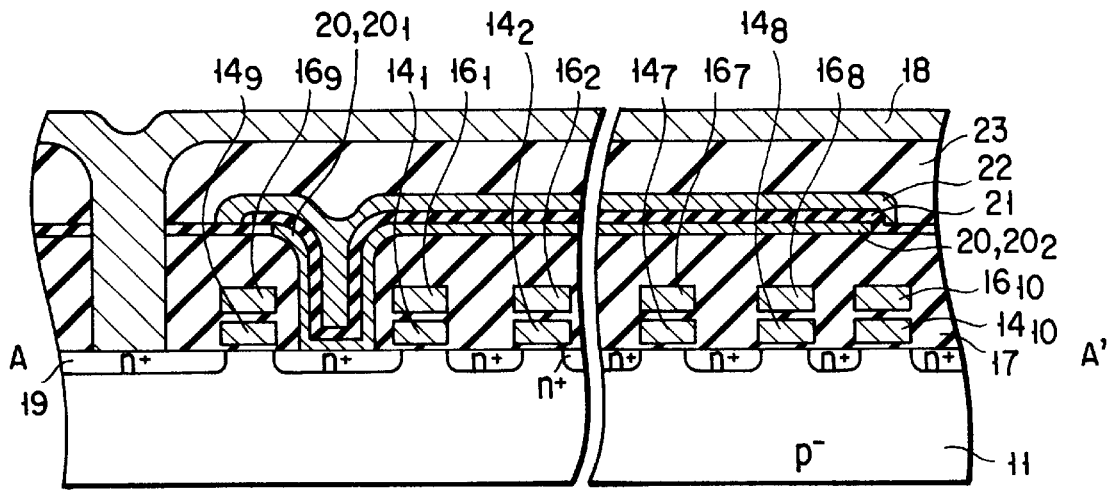
FIG. 5A is a sectional view taken along a line A–A' of the NAND cell shown in FIG. 4A.
Figure 5B:
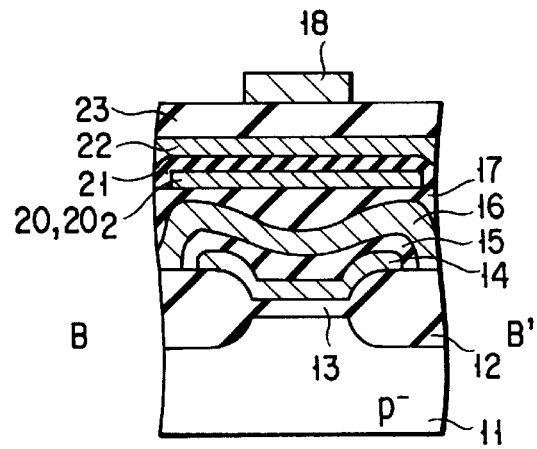
FIG. 5B is a sectional view taken along a line B–B' of the NAND cell shown in FIG. 4A.
Figure 5C:
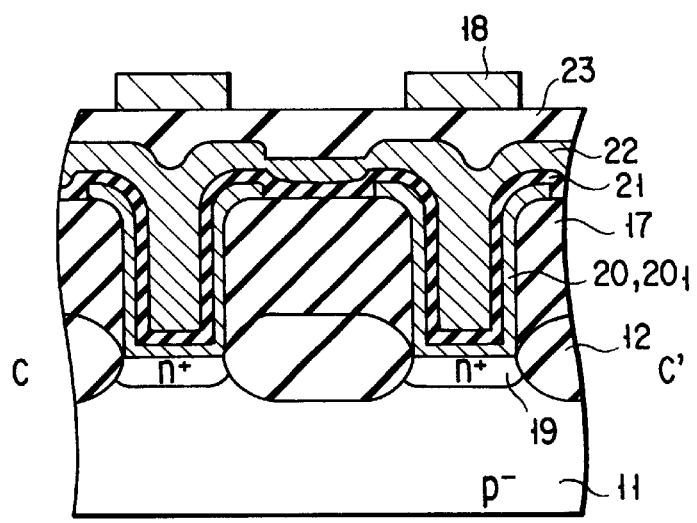
FIG. 5C is a sectional view taken along a line C–C' of the NAND cell shown in FIG. 4A.
Figure 6:
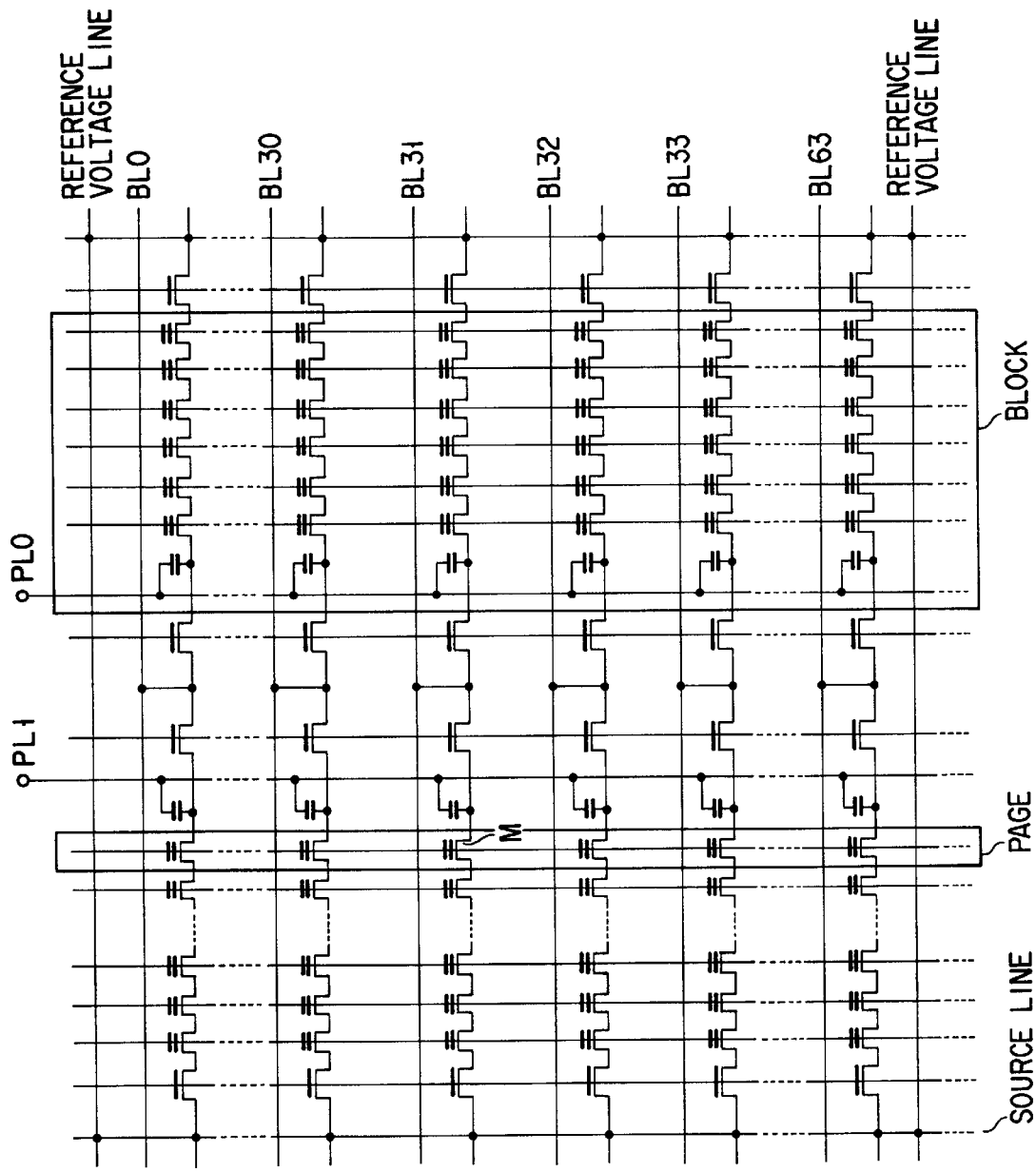
FIG. 6 is a partial circuit diagram of a memory cell array of the NAND EEPROM.

FIGS. 4A to 5C are views showing a NAND EEPROM as a nonvolatile semiconductor memory device of the first embodiment of the present invention. FIG. 4A is a plan view of a NAND cell. FIG. 4B is a circuit diagram of the NAND cell. FIGS. 5A, 5B, and 5C are sectional views taken along lines A–A', B–B', and C–C', respectively, in FIG. 4A. FIG. 6 is a partial circuit diagram of a memory cell array of the NAND EEPROM. As shown in FIGS. 4A to 6, eight memory cells are connected in series to form one cell unit, i.e., a NAND cell. However, another arbitrary integral number of memory cells, e.g., four or sixteen memory cells can also be connected in series to form a NAND cell.

Each memory cell has a stacked gate structure in which a floating gate $14$ ($14_1, 14_2, \ldots, 14_8$) as a charge storage layer and a control gate $16$ ($16_1, 16_2, \ldots, 16_8$) are stacked on an element formation region defined by an element isolation region 12 in a p-type well 11 of a silicon semiconductor substrate (not shown). In this stacked gate structure, a first gate insulating film 13 between the semiconductor substrate 11 and the floating gate 14 serves as a tunnel oxide film for injecting or clearing electrons into or from the floating gate 14. The floating gate 14 and the control gate 16 is capacitively coupled with each other via a second gate insulating film 15. An n-type diffusion layer 19 is used as a source in one of two adjacent memory cells and as a drain in the other. In this manner these memory cells are connected in series.

On the drain and source sides of this NAND cell, selector gates $14_9$ and $16_9$ and selector gates $14_{10}$ and $16_{10}$, respectively, are formed by the same process as the floating gate 14 and the control gate 16 of each memory cell. The first and second layers of each pair of the selector gates $14_9$ and $16_9$ and the selector gates $14_{10}$ and $16_{10}$ are connected in a desired portion (not shown). Additionally, the upper portion of the semiconductor substrate in which the elements are thus formed is covered with a first insulating interlayer 17. In this embodiment, one selector gate transistor having the selector gates $14_9$ and $16_9$ is formed on the drain side of the NAND cell, and one selector gate transistor having the selector gates $14_{10}$ and $16_{10}$ is formed on the source side of the NAND cell. However, a plurality of selector gate transistors can also be formed on the drain or source side of the NAND cell.

The control gates 16 in the same row of a plurality of NAND cells arranged in the row direction are connected together to form control gate lines CG1, CG2, . . . , CG8 extending in the row direction. These control gate lines function as so-called word lines. The selector gates $14_9$ and $16_9$ and the selector gates $14_{10}$ and $16_{10}$ are also formed as selector gate lines SG1 and SG2, respectively, extending in the row direction.

In the NAND EEPROM of the first embodiment, an extracting electrode 20 contacting an arbitrary n-type diffusion layer 19 in the NAND cell is formed on the first insulating interlayer 17. A counter electrode 22 which is capacitively coupled with this extracting electrode 20 via a capacitor insulating film 21 is formed above the extracting electrode 20. The upper portion of this counter electrode 22 is covered with a second insulating interlayer 23. Bit lines 18 contacting the n-type diffusion layer 19 on the drain side at one end of the NAND cell are formed on the second insulating interlayer 23.

As shown in FIGS. 4A to 5C, the extracting electrode 20 includes a contact portion $20_1$ directly contacting the n-type diffusion layer 19 and an extracting portion $20_2$ extracted onto the stacked gate structure of each memory cell of the NAND cell. One such extracting electrode 20 is formed in each NAND cell. The capacitor insulating film 21 and the counter electrode 22 are shared by a plurality of NAND cells arranged in the row direction and sharing the control gate lines CG1, CG2, . . . , CG8 as word lines. The counter electrode 22 is connected to one of terminals PL0, PL1, . . . . In other words, the counter electrode 22 and the terminals PL0, PL1, . . . , for supplying a voltage to the counter electrode 22 are formed in units of memory cell array blocks in the NAND EEPROM.

Thus, a capacitor structure composed of the extracting portion $20_2$ of the extracting electrode 20, the capacitor insulating film 21, and the counter electrode 22 is formed for each column in a memory cell array block. Note that it is not always necessary to form this capacitor structure across the entire region in the column direction in each memory cell array block. However, to widen the capacitor to increase the capacitance between the extracting electrode 20 and the counter electrode 22, the capacitor structure is preferably formed to cover the stacked gate structures of all memory cells in the NAND cell. Like the extracting electrode 20, the capacitor insulating film 21 can also be formed in each NAND cell.

The arrangement of a memory cell array is as shown in FIG. 6. One page is composed of, e.g., 256 bytes (256×8) of memory cells. Data is essentially simultaneously written in memory cells of one page. One block is composed of, e.g., 2,048 bytes (2,048×8) memory cells. Data in memory cells of one block is essentially simultaneously erased.

Figure 8:
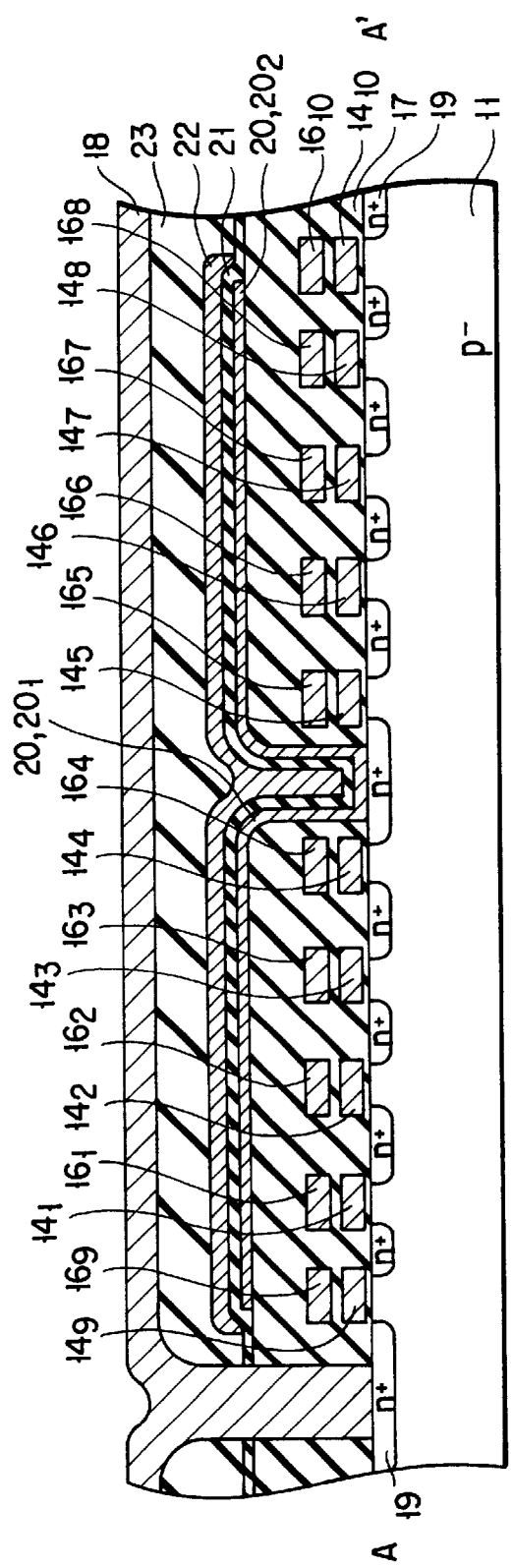
FIG. 8 is a sectional view taken along a line A–A' of the NAND cell shown in FIG. 7A.

FIGS. 7A, 7B, and 8 show a modification of the NAND EEPROM of the first embodiment. FIG. 7A is a plan view of a NAND cell. FIG. 7B is a circuit diagram of the NAND cell. FIG. 8 is a sectional view taken along a line A–A' in FIG. 7A. In the NAND EEPROM shown in FIGS. 4A to 5C, the contact portion $20_1$ of the extracting electrode 20 contacts the n-type diffusion layer 19 between a selector gate transistor near the bit line of the NAND cell and a memory cell adjacent to this selector gate transistor. In this modification of the NAND EEPROM, an n-type diffusion layer 19 between the fourth and fifth memory cells from the bit line is made wider than other n-type diffusion layers 19. The contact portion $20_1$ of the extracting electrode 20 contacts this wide n-type diffusion layer 1.

That is, the n-type diffusion layer 19 which the contact portion $20_1$ of the extracting electrode 20 contacts can be freely set between selector gate transistors near the bit line and source line of a NAND cell. Also, the contact portion $20_1$ of the extracting electrode 20 need not contact only one n-type diffusion layer 19; a plurality of contact portions $20_1$ can contact a plurality of n-type diffusion layers 19 in one NAND cell. When a plurality of contact portions $20_1$ thus contact a plurality of n-type diffusion layers 19 in a NAND cell, a plurality of extracting electrodes 20 can be formed in a one-to-one correspondence with these contact portions $20_1$. However, forming a plurality of wide n-type diffusion layers 19 and bringing contact portions $20_1$ of extracting electrodes 20 into contact with these layers is disadvantageous to miniaturize the memory cell array. Therefore, it is preferable to form a minimum number of contact portions $20_1$ of extracting electrodes 20 in a NAND cell.

Figure 9:
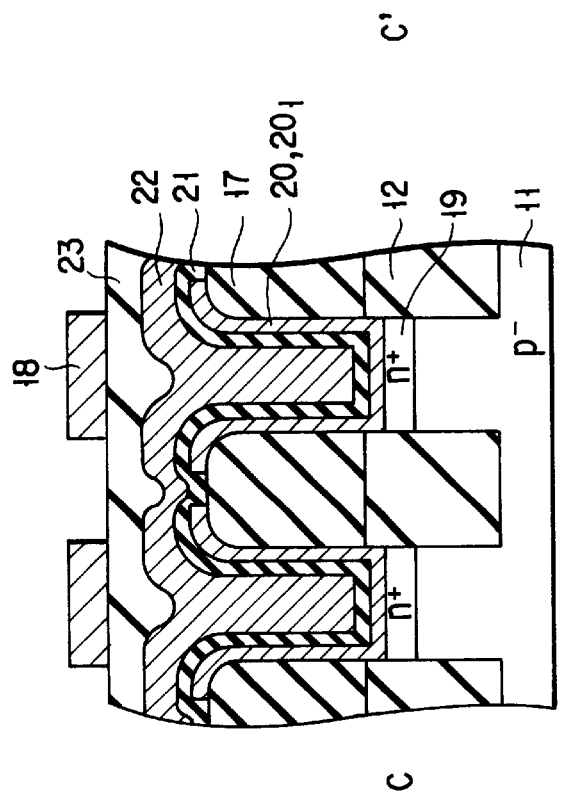
FIG. 9 is a sectional view taken along the line C–C' in FIG. 4A and showing another modification of the first embodiment.

FIG. 9 shows another modification of the NAND EEPROM of the first embodiment. FIG. 9 is a sectional view taken along the line C–C' in FIG. 4A. Referring to FIG. 9, an element isolation region 12 having an STI (Shallow Trench Isolation) structure is formed in place of the element isolation region 12 with a LOCOS structure of the NAND EEPROM shown in FIGS. 4A to 5C.

Figure 10:
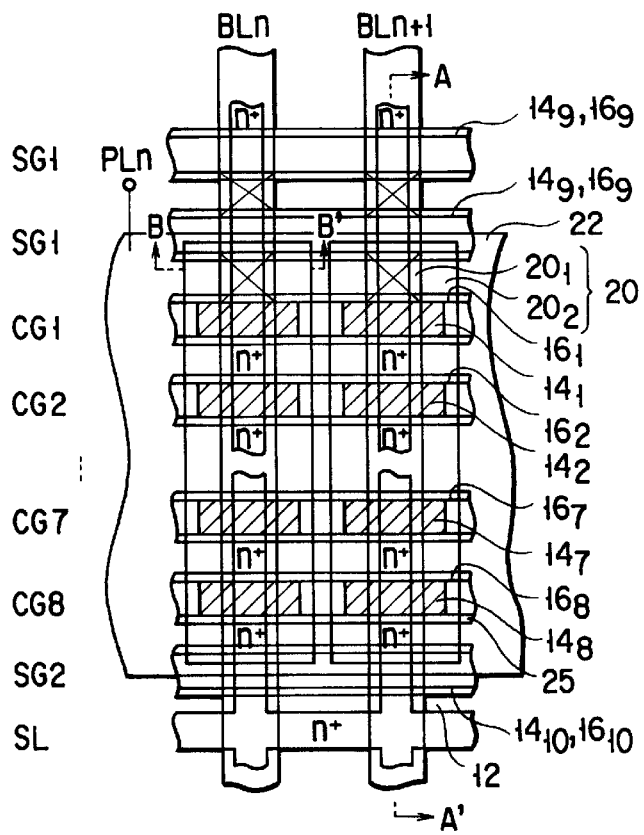
FIG. 10 is a plan view showing a NAND cell of a NAND EEPROM using a self-alignment contact technique in the first embodiment.
Figure 11A:
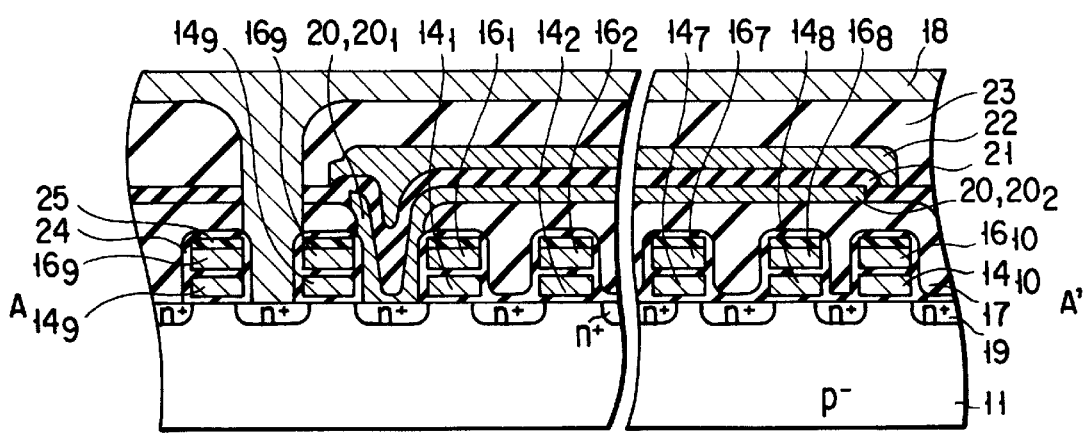
FIG. 11A is a sectional view taken along a line A–A' of the NAND cell shown in FIG. 10.
Figure 11B:
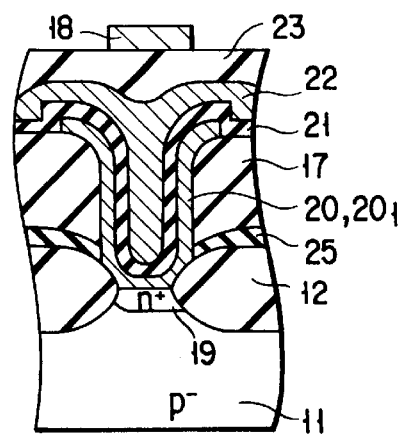
FIG. 11B is a sectional view taken along a line B–B' of the NAND cell shown in FIG. 10.

In all of the above NAND EEPROMs, the n-type diffusion layer which the contact portion of the extracting electrode contacts is made wider than other n-type diffusion layers in the same NAND cell. However, the contact portion which contacts the n-type diffusion layer can also be formed in self-alignment with the gates of memory cells or selector gate transistors without particularly widening the n-type diffusion layer which the contact portion contacts. FIGS. 10, 11A, and 11B show a NAND EEPROM using this self-alignment contact technique. FIG. 10 is a plan view of a NAND cell. FIGS. 11A and 11B are sectional views taken along lines A–A' and B–B', respectively, in FIG. 10.

As shown in FIG. 11A, on control gate lines CG1, CG2, . . . , CG8 of memory cells and selector gate lines SG1 and SG2 of selector gate transistors, a mask film 24 having a film thickness of e.g., 200 nm is formed in self-alignment with the gates. Additionally, the whole memory cell array is covered with a thin insulating film 25 having a film thickness of, e.g., 100 nm. Note that silicon nitride films or the like having different etching selectivity from that of a first insulating interlayer 17 are used as the mask film 24 and the thin insulating film 25.

That is, since the mask film 24 and the thin insulating film 25 having different etching selectivity from that of the first insulating interlayer 17 are formed, these mask film 24 and thin insulating film 25 are etched little when a contact hole connecting to an n-type diffusion layer 19 is formed in a contact portion $20_1$. Consequently, the gates of memory cells and selector gate transistors are not exposed, and an element isolation region 12 between adjacent NAND cells is not removed. Accordingly, the contact portion $20_1$ can be formed in self-alignment with the gates of the memory cells and selector gate transistors and with the element isolation region 12 without particularly widening the n-type diffusion layer 19 which the contact portion $20_1$ contacts. This reduces the pitches of the control gate lines CG1, CG2, . . . , CG8 and the selector gate lines SG1 and SG2 to the minimum design rule.

If the mask film 24 has a stacked structure of a silicon oxide film and a silicon nitride film, the mask film 24 on the upper surface of a gate is also etched away when the thin insulating film 25 on the bottom surface of a contact hole is removed when the contact hole is formed. This prevents a short circuit between a plug material buried in the contact hole and the gate. In this NAND EEPROM as shown in FIGS. 10 and 11A, a bit line contact to an n-type diffusion layer 19 on the drain side at one end of the NAND cell can also be formed in self-alignment with a pair of adjacent selector gate lines SG1 and SG2 and the element isolation region 12.

The operation of the NAND EEPROM of the first embodiment is basically identical with that of a NAND EEPROM having a conventional booster plate electrode.

FIG. 24 shows practical bias states when write, erase, and read operations are performed. As shown in FIG. 24, the terminal PL for supplying a voltage to the counter electrode in a selected block is set to a write voltage Vpp (e.g., 18V) which is the same voltage as a selected word line when data is written, and supplied with 0V and a power-supply voltage Vcc (e.g., 3.3V) when data is erased and read out, respectively. When data is written, a high voltage $V_{pL}$ different from the write voltage Vpp can also be applied to the terminal PL for supplying a voltage to the counter electrode.

Figure 12:
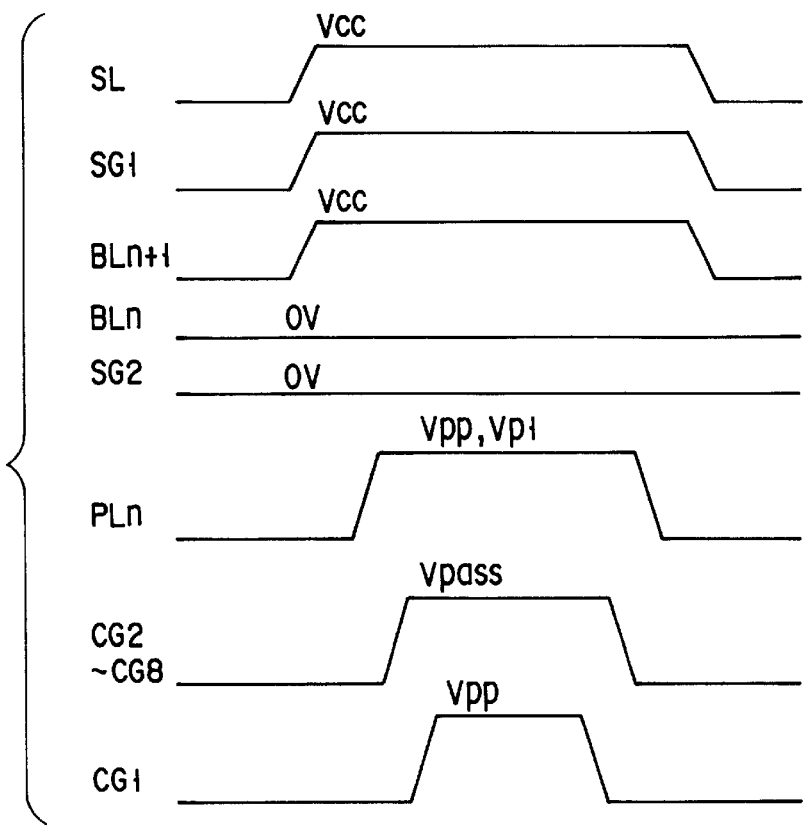
FIG. 12 is a timing chart when data is written in the NAND EEPROM of the first embodiment.

FIG. 12 is a timing chart when data is written in the NAND EEPROM of the first embodiment. This write will be described in detail below. Referring to FIG. 12, of two memory cells connected to the control gate line CG1 in the circuit of the NAND cell shown in FIG. 4B, "0" data is written in a memory cell connected to a bit line BLn, and "1" data is written in a memory cell connected to a bit line BLn+1. However, data write is similarly performed if the other control gate lines CG2, . . . , CG8 of the NAND cell are selected word lines.

First, 0V is supplied to the selector gate line SG2 near the source line SL to switch off the selector gate transistors connected to the selector gate line SG2. At the same time, the source line SL is set to the power-supply voltage Vcc (e.g., 3.3V) to suppress leakage currents from the selector gate transistors.

On the other hand, Vcc is supplied to the selector gate line SG1 near the bit lines BLn and BLn+1, and 0V and Vcc are transferred from the bit lines BLn and BLn+1, respectively, to the NAND cell. In the column of the bit line BLn, the selector gate transistor near the bit line BLn is ON even after 0V is transferred to the NAND cell. In the column of the bit line BLn+1, an initial potential obtained by subtracting the threshold value of the selector gate transistor near the bit line BLn+1 from Vcc is transferred to the NAND cell. After that, the selector gate transistor is cut off.

In this stage, the potentials of the control gate lines CG1, CG2, . . . , CG8 are 0V. So, a memory cell connected to each control gate line is ON or OFF in accordance with its data, and the selector gate transistor near the source line SL is OFF as described above. Accordingly, in the column of the bit line BLn+1, the NAND cell channels and n-type diffusion layers are charged to an initial potential Vchinit and then float between the selector gate transistor near the bit line BLn+1 and an OFF memory cell closest to the bit line BLn+1 or the selector gate transistor near the source line SL.

Next, a high voltage such as the write voltage Vpp (e.g., 18V) is applied to a terminal PLn for supplying a voltage to the counter electrode. Accordingly, a potential Vchpr1 of the NAND cell channels and n-type diffusion layers that float in the column of the bit line BLn+1 is selectively booted to $$Vchpr1 = Vchinit + Ccapa \cdot Vpp/(Ccapa + Cchpr)$$

where Ccapa is the capacitance between the counter electrode and the extracting electrode, and Cchpr is the sum of the depletion layer capacitance and junction capacitance of the floating NAND cell channels and n-type diffusion layers.

After that, an intermediate voltage Vpass (e.g., 6V) is supplied to the control gate lines CG2, . . . , CG8 as non-selected word lines. Consequently, in the column of the bit line BLn+1, both of the selector gate transistors near the bit line BLn+1 and source line SL are OFF, and all memory cells in the NAND cell are ON. Therefore, all floating channels of the NAND cell are booted to a write inhibit voltage. Subsequently, the write voltage Vpp (e.g., 18V) is applied to the control gate line CG1 as a selected word line.

As a consequence, of memory cells connected to the control gate line CG1, electrons are injected into the floating gate of each memory cell selected for data write in the column of the bit line BLn to the channel of which 0V is transferred, thereby writing "0" data in this memory cell. In contrast, essentially no electrons are injected into the floating gate of each memory cell not selected for data write in the column of the bit line BLn+1 whose channel potential is raised to the write inhibit voltage. Hence, "1" data by which the threshold value is kept negative is written in this memory cell.

Figure 13:
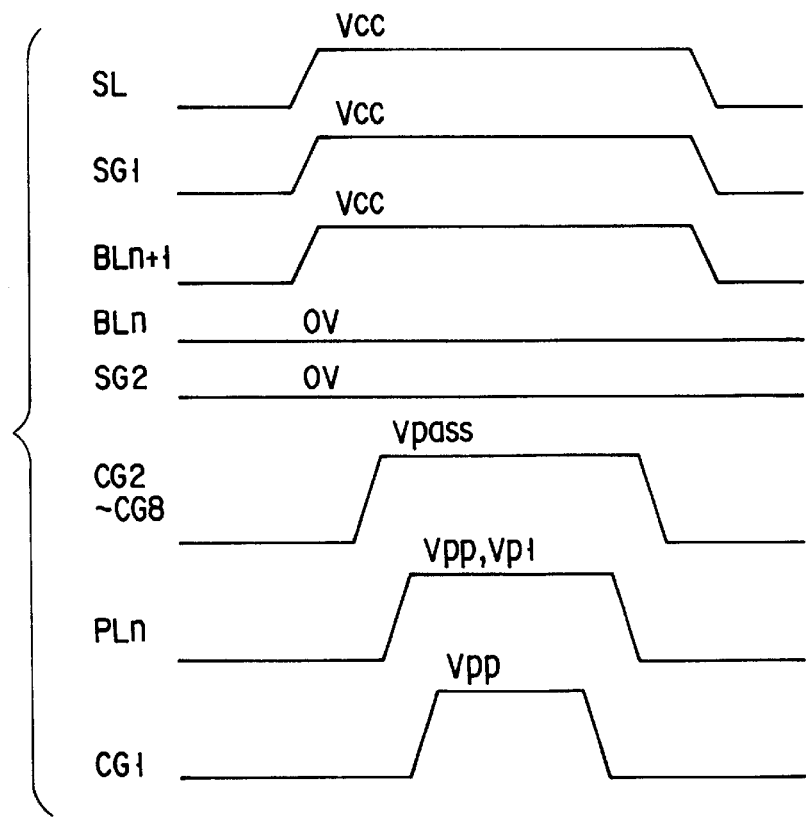
FIG. 13 is a timing chart showing a modification of the timing chart shown in FIG. 12.

The timings of data write to the NAND EEPROM of the first embodiment can be arbitrary to a large extent. For example, as a modification of the timing chart shown in FIG. 12, FIG. 13 shows a timing chart in which the timing of Vpass supply to non-selected word lines is changed.

In this modification, 0V is transferred to the channels of the NAND cell in the column of the bit line BLn. In the column of the bit line BLn+1, the channels of the NAND cell are charged to the initial potential and float. After that, Vpass is supplied to the control gate lines CG2, . . . , CG8 as non-selected word lines. Subsequently, Vpp is applied to the terminal PLn for supplying a voltage to the counter electrode. The rest is the same as the timing chart shown in FIG. 12. When Vpass is supplied to the control gate lines CG2, . . . , CG8 at this timing, the channel potential of the NAND cell in the column of the bit line BLn+1 is booted to a write inhibit voltage Vch in a common self-boost write:

$$Vch=Vsg-Vsgth(Vchinit)+Cr1(Vpass-Vpassth(Vchinit)) +Cr2(Vpp-Vpassth(Vchinit))$$

where Vsg is the potential of the selector gate line SG1 near the bit line BL, Vsgth (Vchinit) is the threshold value of the selector gate transistor near the bit line BLn+1 when the initial channel potential of the NAND cell is Vchinit, Cr1 and Cr2 are the channel boot ratios, Cr1 being the ratio of the total channel capacitance to the gate-channel capacitance of all memory cells connected to the control gate lines CG2, . . . , CG8, and Cr2 being the ratio of the total channel capacitance to the gate-channel capacitance of a memory cell connected to the control gate line CG1, and Vpassth (Vchinit) is the gate potential necessary to turn on a memory cell when the NAND cell channel potential is Vchinit.)

When Vpp, for example, is applied to the terminal PL for supplying a voltage to the counter electrode as described above, a channel potential Vchpr2 of the NAND cell is further booted to $$Vchpr2=Vch+Ccapa \cdot Vpp/(Ccapa+Cch)$$

where Cch is the sum of the depletion layer capacitance and junction capacitance of the NAND cell channels and n-type diffusion layers between the selector gate transistor near the bit line BLn+1 and the selector gate transistor near the source line SL. Even in this modification, the channel potential of each memory cell not selected for data write in the column of the bit line BLn+1 can be raised to a sufficiently high write inhibit voltage.

A method of fabricating the NAND EEPROM of the first embodiment will be described below. FIGS. 14A to 14D, 15A, and 15B are longitudinal sectional views showing the steps of the method of fabricating the NAND EEPROM of the first embodiment.

First, a p-type well 11 is formed by doping a p-type impurity into at least that region in a silicon semiconductor substrate (not shown) where a memory cell array is to be formed. This p-type well 11 can be formed in either an n-type silicon semiconductor substrate or an n-type well in a p-type silicon semiconductor substrate. Subsequently, a field oxide film with a LOCOS structure or a buried oxide film with an STI structure (neither is shown) is formed in an element isolation region of the p-type well 11 by selective oxidation or the like. Additionally, a p-type impurity for adjusting a threshold value is doped into a surface of the substrate where necessary.

Figure 14A:
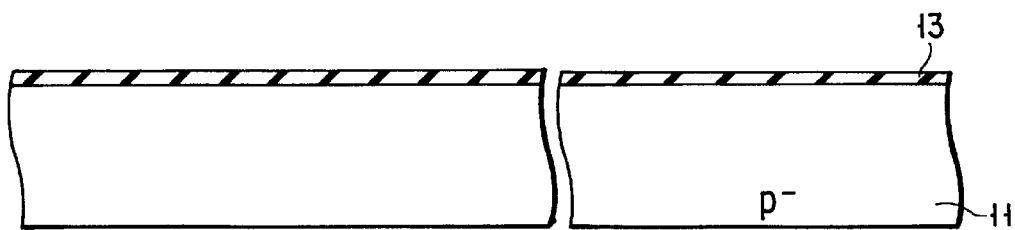
FIGS. 14A, 14B, 14C and 14D are longitudinal sectional views showing the steps of a method of fabricating the NAND EEPROM of the first embodiment.
Figure 14B:
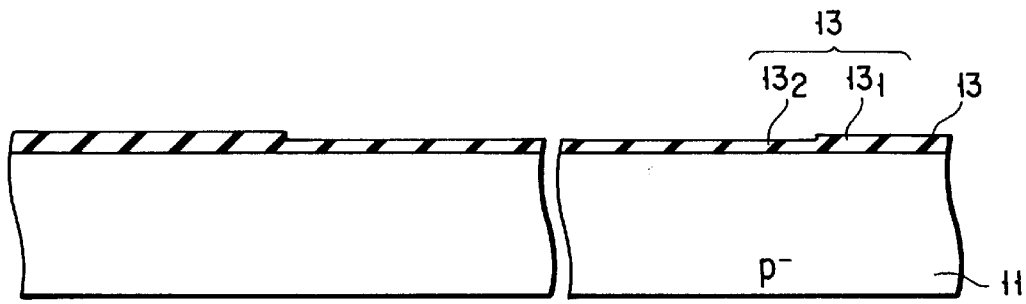

Next, as shown in FIG. 14A, a 9-nm thick thermal oxide film serving as a first gate insulating film 13 of a memory cell is formed on the entire surface of the p-type well 11. It is also possible to form thermal oxide films having different film thicknesses as a tunnel oxide film of a memory cell and a gate insulating film of a selector gate transistor. If this is the case, as shown in FIG. 14B, a 16-nm thick thermal oxide film serving as a gate insulating film $13_1$ of a selector gate transistor is formed. After that, a resist pattern (not shown) covering only the region where the selector gate transistor is to be formed is formed by photolithography. The thermal oxide film in the region where a memory cell is to be formed is removed by an aqueous ammonium fluoride solution or the like. After the resist pattern is removed, a 9-nm thick thermal oxide film serving as a tunnel oxide film $13_2$ is formed in the region where the memory cell is to be formed. In this manner gate oxide films having different thicknesses are formed in the region where the memory cell is to be formed and in the region where the selector gate transistor is to be formed. Before the gate oxide films are formed in the regions where the memory cell and selector gate transistor are to be formed, it is also possible to form a MOS transistor gate oxide film for a peripheral circuit on the entire surface of the substrate and selectively remove this gate oxide film from the surface of the p-type well 11 where a memory cell array is to be formed.

Alternatively, after a gate oxide film is formed, an element isolation region having a STI structure as shown in FIG. 9 can be formed. In this case, a trench is formed by etching a polysilicon layer, gate oxide layer and substrate successively after the polysilicon layer as a part of the floating gate is deposited. Next, an insulating film is buried in the trench, thereby forming a floating gate. Namely, the floating gate is formed in the self-alignment technique.

Next, a 150-nm thick first polysilicon layer 14' is deposited on the first gate insulating film 13. Note that the resistance of this first polysilicon layer 14' is usually lowered by doping $1\times10^{20}$ to $4\times10^{20}$ cm$^{-3}$ of P by using POCl$_3$ or the like. A resist pattern (not shown) formed on the first polysilicon layer 14' by photolithography is used as a mask to etch the first polysilicon layer 14' by RIE or the like, forming slits for separating the first polysilicon layer 14' serving as floating gates 14 in the row direction.

Figure 14C:
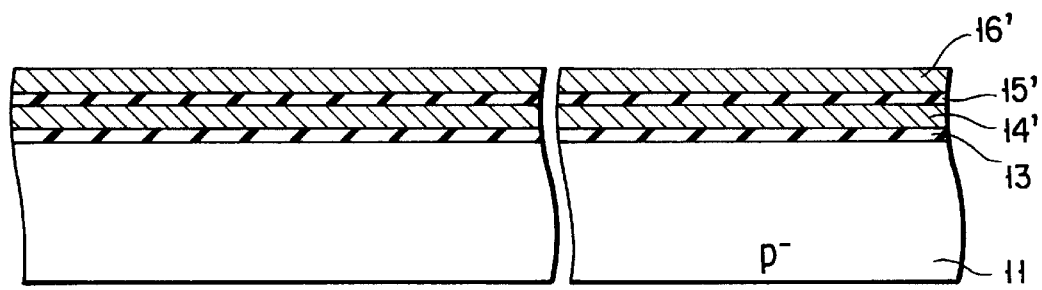

After that, a silicon oxide film, silicon nitride film and silicon oxide film, i.e., an ONO film 15' serving as a second gate oxide film 15 is sequentially stacked by thermal oxidation or CVD or the like. Additionally, as shown in FIG. 14C, a stacked film 16' composed of a 100-nm thick second polysilicon layer doped with about $1\times10^{20}$ to $4\times10^{20}$ cm$^{-3}$ of P or the like, as in the case of the first polysilicon layer 14', and a 150-nm thick high-melting metal silicide film made from WSi or the like is deposited. To fabricate the NAND EEPROM as shown in FIGS. 10, 11A, and 11B, a mask film such as a silicon nitride film is properly deposited on the high-melting metal silicide film. After the ONO film 15' is formed, it is also possible to selectively remove the oxide film from the surfaces of the ONO film 15', the first polysilicon film 14', and the substrate in a region serving as a peripheral circuit and form a MOS transistor gate oxide film for this peripheral circuit.

Figure 14D:
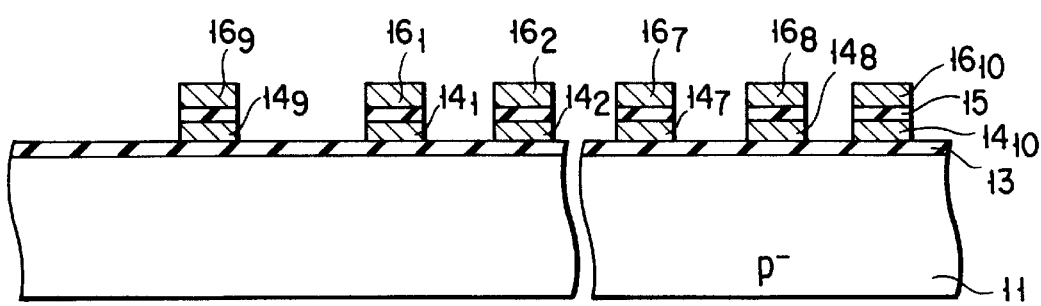

Next, a resist pattern (not shown) formed on the resultant structure by photolithography is used as a mask to etch the first polysilicon layer 14', the ONO film 15', the second polysilicon layer, and the high-melting metal silicide film by self-alignment. Consequently, as shown in FIG. 14D, stacked gate structures each having a floating gate 14, a second gate insulating film 15, and a control gate 16 are formed on the p-type well 11. It is also possible to form a resist pattern covering the region where a memory cell array is to be formed and use this resist pattern as a mask to process the second polysilicon layer, high-melting metal silicide film, and the like in the region serving as a peripheral circuit, thereby forming the gate electrodes of MOS transistors for the peripheral circuit.

Figure 15A:
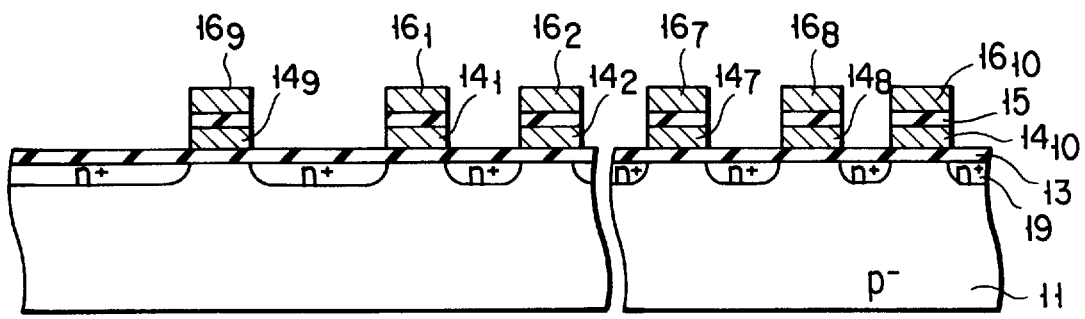
FIGS. 15A and 15B are longitudinal sectional views showing the steps of the method of fabricating the NAND EEPROM of the first embodiment.

After the resist pattern is removed, the obtained stacked gate structures and peripheral circuit MOS transistor gate electrodes are used as masks to dope an n-type impurity such as P or As into the substrate by ion implantation or the like. Additionally, post-oxidation and annealing for impurity activation are performed as needed to form, as shown in FIG. 15A, an n-type diffusion layer 19 for forming the source and drain regions of memory cell transistors or peripheral circuit MOS transistors. Furthermore, to fabricate the NAND EEPROM shown in FIGS. 10, 11A, and 11B, the whole memory cell array is subsequently covered with a 100-nm thick insulating layer such as a silicon nitride film. Side wall spacer can also be formed on the side surfaces of each stacked gate structure.

A 500-nm thick BPSG film is then formed as a first insulating interlayer 17 on the entire substrate surface by CVD or the like. The first insulating interlayer 17 is etched by photolithography to form a contact hole for a contact portion $20_1$ of an extracting electrode 20 above a desired n-type diffusion layer 19. To compensate for any misalignment produced when the contact hole is formed, an n-type impurity can also be appropriately ion-implanted onto the bottom surface of the contact hole. To fabricate the NAND EEPROM shown in FIGS. 10, 11A, and 11B, after the contact hole is formed in the first insulating interlayer 17 by using the self-alignment contact technique, the thin insulating film covering the whole memory cell array and having different etching selectivity from that of the first insulating interlayer must be etched away from the bottom of the contact hole.

Figure 15B:
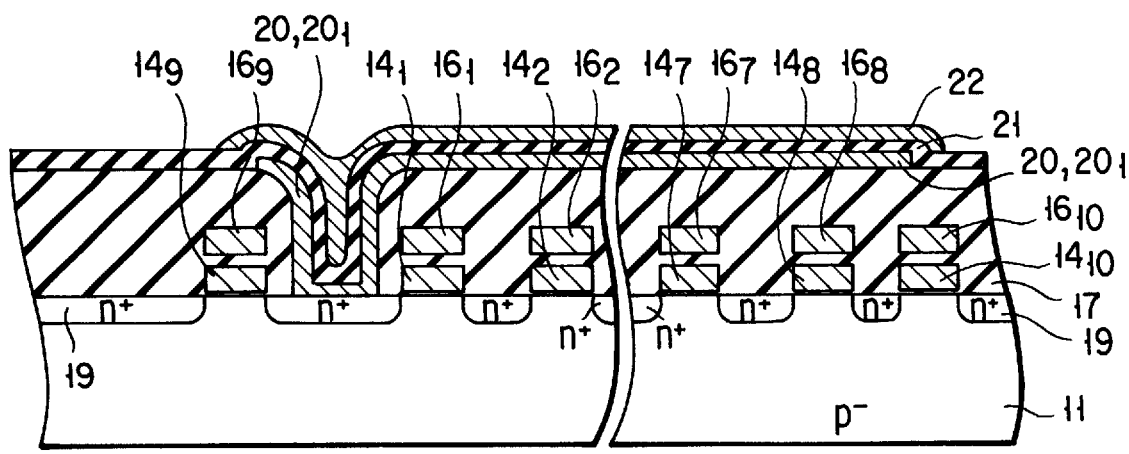

Next, as shown in FIG. 15B, a 100-nm thick conductive polysilicon layer serving as the extracting electrode 20 is deposited by CVD or the like and formed into a pattern corresponding to the planar pattern of a NAND cell by etching, thereby forming the extracting electrode 20. If an n-type impurity is doped into the conductive polysilicon layer, this n-type impurity can be solid-phase-diffused from the conductive polysilicon layer into a portion below the contact hole bottom surface when annealing is performed in a post-step. A 20-nm thick silicon oxide film serving as a capacitor insulating film 21 is then formed on the extracting electrode 20 by thermal oxidation or CVD. On top of this silicon oxide film, a 150nm thick conductive polysilicon layer and a 200-nm thick high-melting metal silicide film such as an SWi film serving as a counter electrode 22 are deposited. Furthermore, photo-lithography is used to separate the conductive polysilicon layer and high-melting metal silicide film serving as the counter electrode 22 in units of NAND cells in the column direction, thereby forming the counter electrode 22.

Subsequently, although not shown, a second insulating interlayer 23 such as a silicon oxide film or BPSG film is deposited on the entire substrate surface by CVD or the like.

In this second insulating interlayer 23, a contact hole for a bit line contact is formed above an n-type diffusion layer 19 near the drain at one end of the NAND cell. A bit line 18 to be electrically connected to the n-type diffusion layer 19 is formed through this contact hole. More specifically, a plug made from W or the like is buried in the contact hole and planarized, and Al deposited on the second insulating interlayer is patterned into the form of an interconnection in the column direction. Note that an n-type impurity is doped, if necessary, to a portion underneath the contact hole bottom surface by ion implantation or solid-phase diffusion from the plug, as in the case of the contact portion $20_1$ of the extracting electrode 20. If the whole memory cell array is covered with a thin insulating film having different etching selectivity from that of the second insulating interlayer 23, this thin insulating film is etched away from the bottom of the contact hole. In this manner the NAND EEPROM as shown in FIGS. 4A to 5C is fabricated.

In the NAND EEPROM of the first embodiment as described above, the channel potential of a memory cell in which "1" data is to be written can be raised to a sufficiently high write inhibit voltage by using the capacitive coupling between the extracting electrode contacting the n-type diffusion layer in the NAND cell and the counter electrode. Accordingly, it is possible to suppress variations in the threshold values of memory cells in which "1" data is to be written and thereby avoid degradation of the memory cell write error characteristics in the self-boost write method. For this reason, when data write is performed a sufficiently high write inhibit voltage can be obtained in a memory cell in which "1" data is to be written without excessively raising the intermediate voltage Vpass of a non-selected word line in a selected block. As a consequence, write errors can be effectively prevented even in memory cells connected to non-selected word lines near a NAND cell to the channel of which 0V is transferred from a bit line.

Additionally, if a planar capacitor structure is formed in which the extracting electrode is extracted onto a NAND cell and opposes the counter electrode on the NAND cell, the capacitance Ccapa of the obtained capacitor structure is much larger than the capacitance between a conventional booster plate electrode and an n-type diffusion layer. This greatly raises the write inhibit voltage and effectively suppresses write errors. Also, the extracting electrode need only contact at least one n-type diffusion layer in a NAND cell, i.e., it is unnecessary to bury booster plate electrodes between all adjacent memory cells in a NAND cell. This does not interfere with the shrinkage of the memory cell array. Furthermore, since planar capacitor structures can be formed, the film thickness control-lability of an insulating film serving as a capacitor portion is much better than when booster plate electrodes are opposed each other via an insulating film between adjacent memory cells in a NAND cell. Accordingly, the capacitances of these capacitor structures can be made uniform, so the channel potentials of all memory cells in which "1" data is to be written can be equally booted. Consequently, variations in the threshold values of memory cells can also be reduced.

Figure 16:
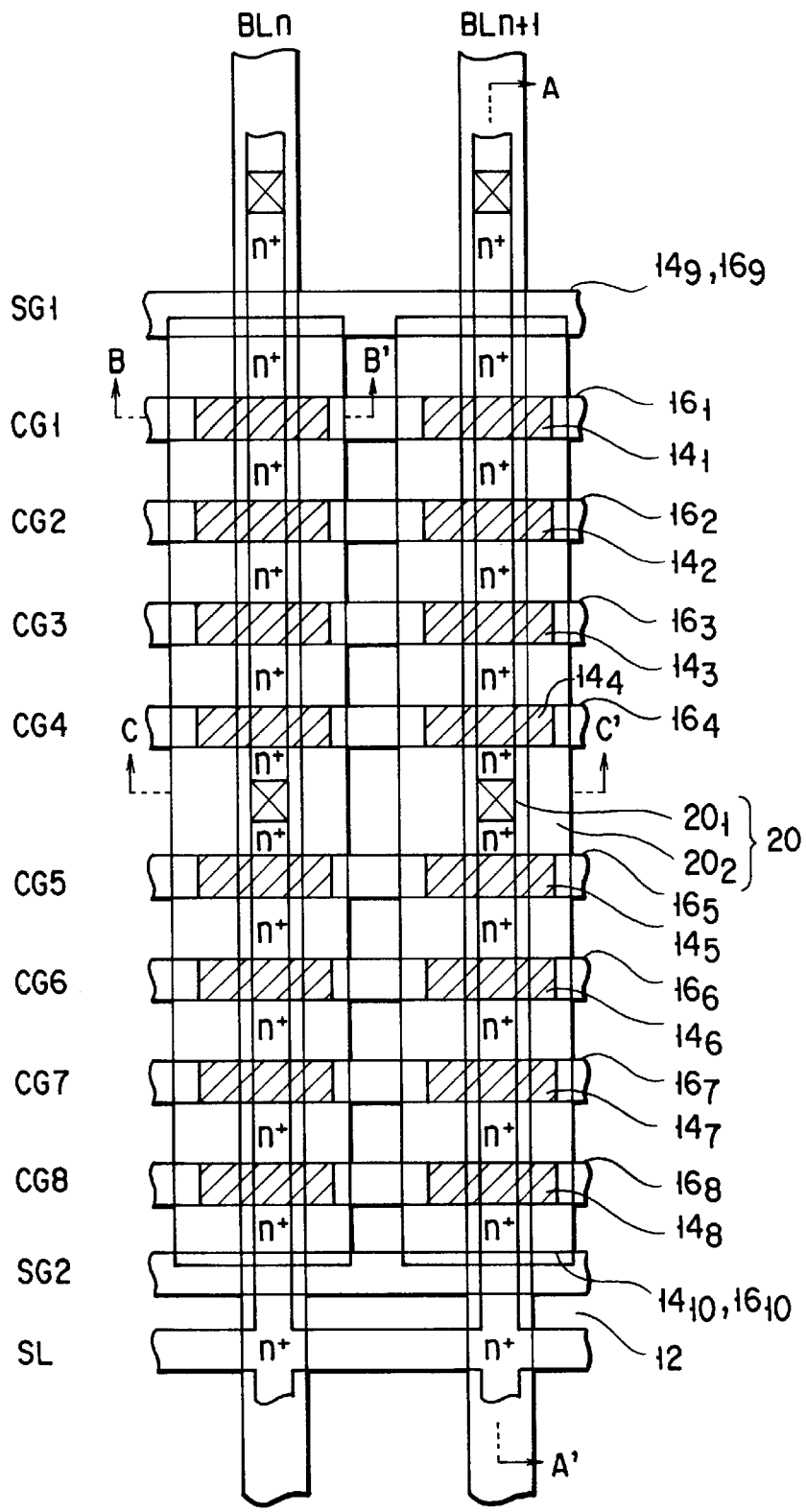
FIG. 16 is a plan view showing a NAND cell in a NAND EEPROM of the second embodiment.
Figure 17:
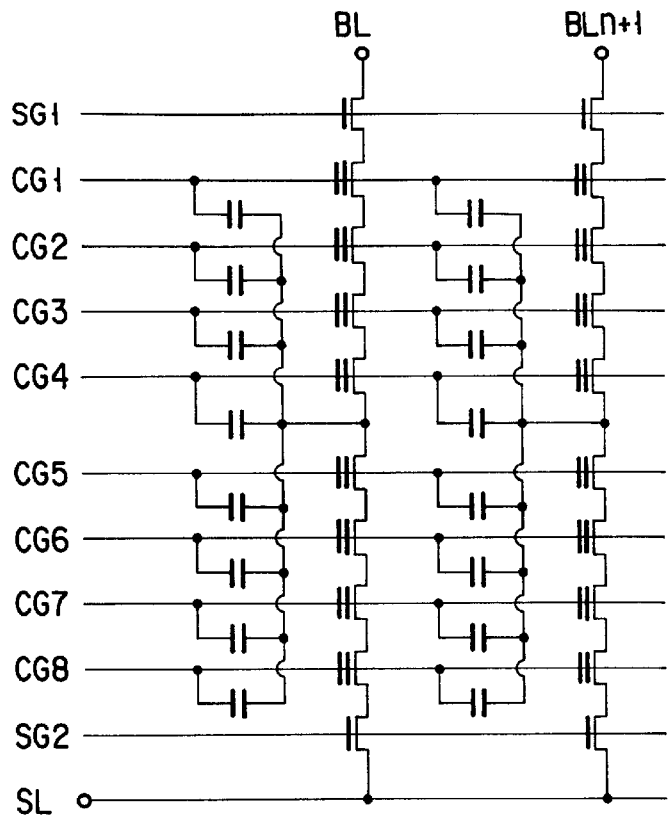
FIG. 17 is a circuit diagram of the NAND cell shown in FIG. 16.
Figure 18A:
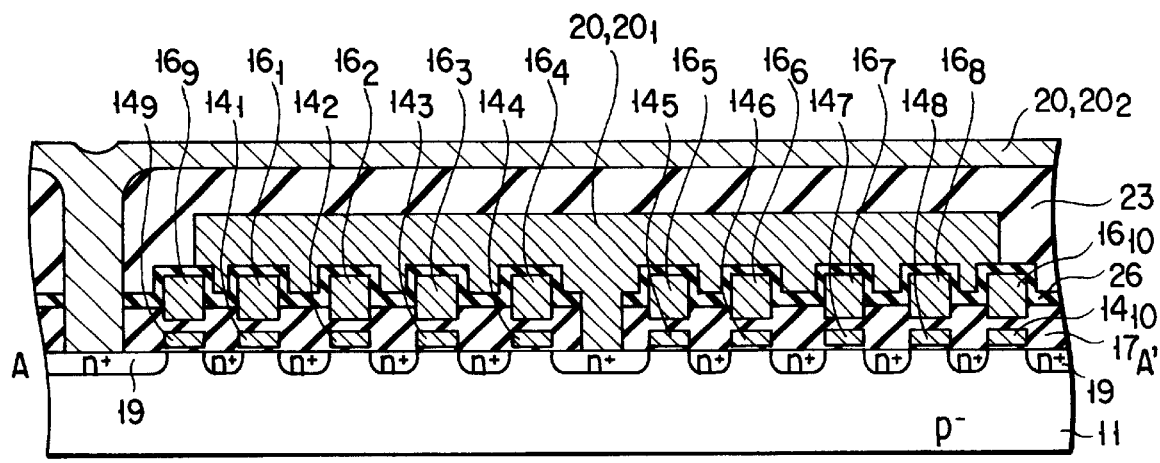
FIG. 18A is a sectional view taken along a line A–A' of the NAND cell shown in FIG. 16.
Figure 18B:
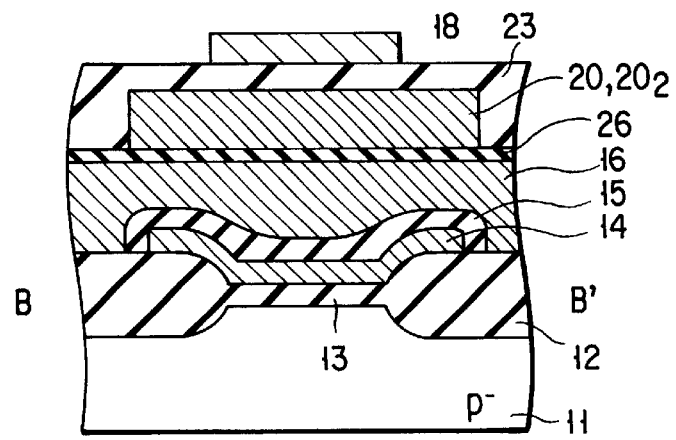
FIG. 18B is a sectional view taken along a line B–B' of the NAND cell shown in FIG. 16.
Figure 18C:
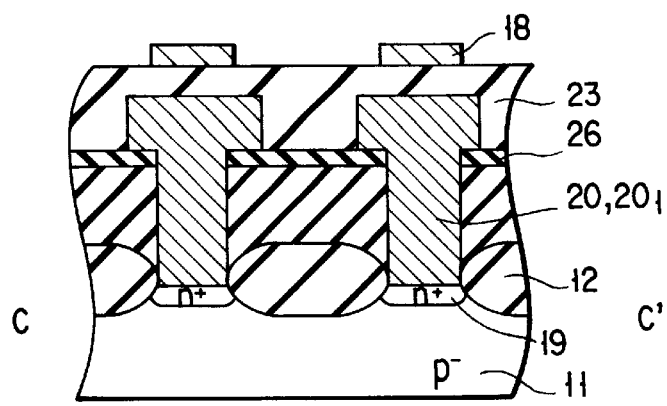
FIG. 18C is a sectional view taken along a line C–C' of the NAND cell shown in FIG. 16.

A NAND EEPROM as a nonvolatile semiconductor memory device of the second embodiment of the present invention will be described below with reference to FIGS. 16 to 18C. FIG. 16 is a plan view of a NAND cell. FIG. 17 is a circuit diagram of the NAND cell. FIGS. 18A, 18B, and 18C are sectional views taken along lines A–A', B–B', and C–C', respectively, in FIG. 16. The NAND EEPROM of this second embodiment is basically the same as the NAND EEPROM of the first embodiment except that an extracting electrode 20 contacting an arbitrary n-type diffusion layer 19 in a NAND cell is essentially capacitively coupled with the gate of each memory cell in the NAND cell, and that neither a capacitor insulating film nor a counter electrode is formed on the extracting electrode 20. Therefore, the same reference numerals as in FIGS. 4A to 5C showing the NAND EEPROM of the first embodiment denote the same parts in FIGS. 16 to 18C, and a detailed description thereof will be omitted.

In the NAND EEPROM of the second embodiment as shown in FIGS. 16 to 18C, an extracting electrode 20 having a contact portion $20_1$ directly contacting an arbitrary n-type diffusion layer 19 in the NAND cell and an extracting portion $20_2$ extracted onto a first insulating interlayer 17 is formed. The extracting portion $20_2$ of this extracting electrode 20 opposes control gates 16 ($16_1$, $16_2$, ..., $16_8$) of the NAND cell via a dielectric film 26 forming a capacitor portion. As in the NAND EEPROM of the first embodiment, one such extracting electrode 20 is formed in each NAND cell. However, as in the NAND EEPROM of the first embodiment, a plurality of contact portions $20_1$ or extracting portions $20_2$ of the extracting electrode 20 can also be formed.

In the NAND EEPROM of the second embodiment as described above, the extracting portion $20_2$ of the extracting electrode 20 contacting an arbitrary n-type diffusion layer 19 in a NAND cell is capacitively coupled with the upper surface of the gate of each memory cell of the NAND cell. More preferably, the extracting portion $20_2$ is also capacitively coupled with the side surfaces of gates as shown in FIG. 18A. Note that it is not always necessary to form the extracting electrode 20 across the entire region in the column direction of the NAND cell so that the extracting electrode 20 reaches portions above selector gates $14_9$ and $16_9$ and selector gates $14_{10}$ and $16_{10}$. However, to increase the capacitance between the extracting electrode 20 and the gate of each memory cell, the extracting electrode 20 is preferably so formed as to reach portions above the stacked gate structures of all memory cells.

Figure 19:
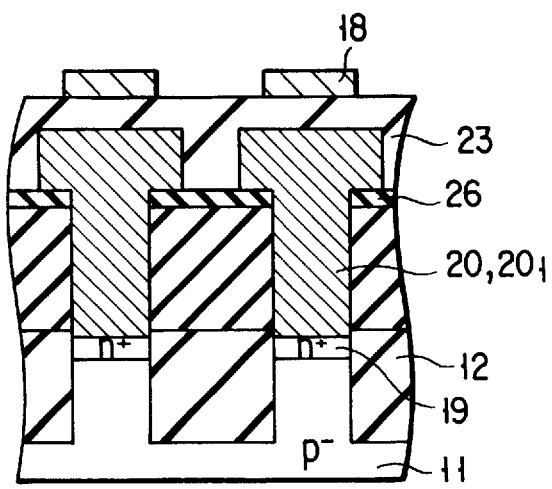
FIG. 19 is a sectional view taken along the line C–C' in FIG. 16 and showing a modification of the second embodiment.

FIG. 19 shows a modification of the NAND EEPROM of the second embodiment. FIG. 19 is a sectional view taken along the line C–C' in FIG. 16. In this modification, an element isolation region 12 with an STI structure is formed instead of an element isolation region 12 with a LOCOS structure in the NAND EEPROM shown in FIGS. 16 to 18C.

Figure 20:
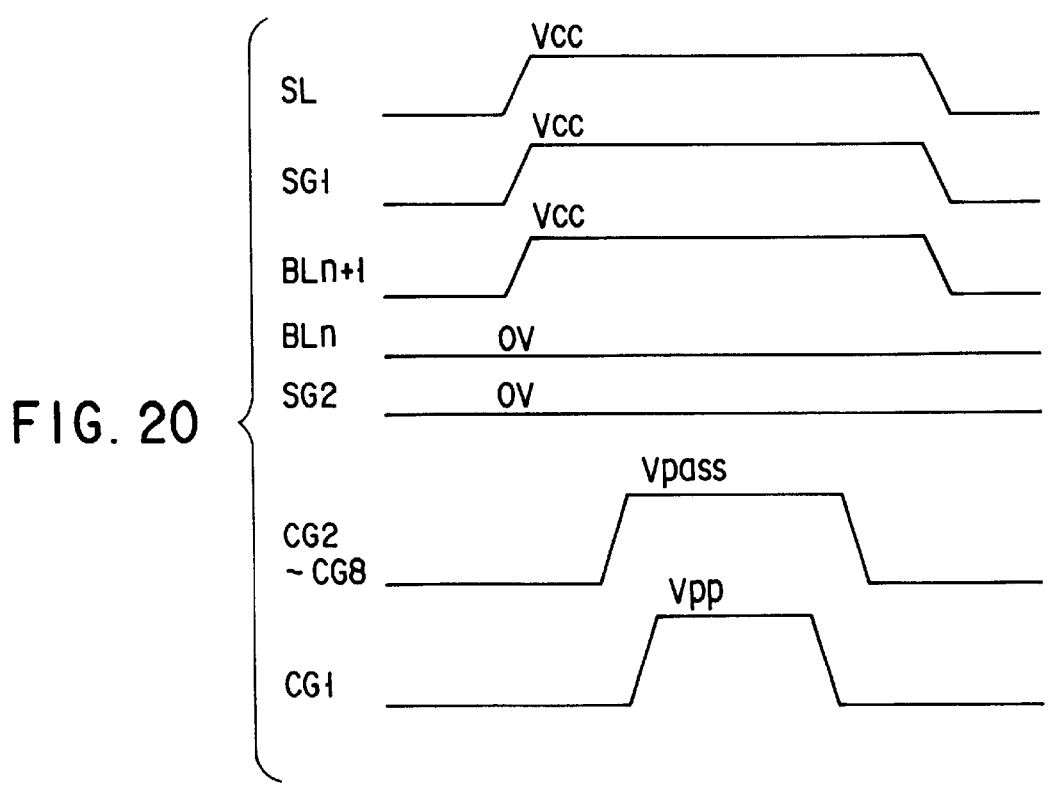
FIG. 20 is a timing chart when data is written in the NAND EEPROM of the second embodiment.

In the second embodiment, self-boost writes, erases, and reads are performed in bias states shown in FIG. 25 as well as that of the conventional NAND EEPROM. FIG. 20 shows a timing chart when data is written in the NAND EEPROM of the second embodiment. This write will be described below. Assume that, of two memory cells connected to a control gate line CG1 in the circuit of the NAND cell shown in FIG. 17, "0" data is written in a memory cell connected to a bit line BLn, and "1" data is written in a memory cell connected to a bit line BLn+1. Note that data write is similarly performed even when other control gate lines CG2, ..., CG8 of the NAND cell are selected word lines.

That is, data write to the NAND EEPROM of the second embodiment is basically performed in the same manner as in the conventional self-boost write method. First, 0V is supplied to a selector gate line SG2 near a source line SL to switch off all selector gate transistors connected to this selector gate line SG2. At the same time, the source line SL is set to a power-supply voltage Vcc (e.g., 3.3V) to suppress leakage currents from the selector gate transistors.

On the other hand, Vcc is supplied to a selector gate line SG1 near the bit lines BLn and BLn+1, and 0V and Vcc are transferred from the bit lines BLn and BLn+1, respectively, to the NAND cell. In the column of the bit line BLn, the selector gate transistor near the bit line BLn is ON even after 0V is transferred to the NAND cell. In the column of the bit line BLn+1, an initial potential obtained by subtracting the threshold value of the selector gate transistor near the bit line BLn+1 from Vcc is transferred to the NAND cell. After that, the selector gate transistor is cut off.

In this stage, the potentials of the control gate lines CG1, CG2, ..., CG8 are 0V. So, a memory cell connected to each control gate line is ON or OFF in accordance with its data, and the selector gate transistor near the source line SL is OFF as described above. Accordingly, in the column of the bit line BLn+1, the NAND cell channels and n-type diffusion layers are charged to an initial potential Vchinit and then float between the selector gate transistor near the bit line BLn+1 and an OFF memory cell closest to the bit line BLn+1 or the selector gate transistor near the source line SL.

Next, an intermediate voltage Vpass (e.g., 6V) is supplied to the control gate lines CG2, ..., CG8 as non-selected word lines. Consequently, in the column of the bit line BLn+1, both of the selector gate transistors near the bit line BLn+1 and source line SL are OFF, and all memory cells in the NAND cell are ON. Therefore, all floating channels of the NAND cell are booted to a write inhibit voltage. Subsequently, a write voltage Vpp (e.g., 18V) is applied to the control gate line CG1 as a selected word line. As a consequence, of memory cells connected to the control gate line CG1, electrons are injected into the floating gate of each memory cell selected for data write in the column of the bit line BLn to the channel of which 0V is transferred, thereby writing "0" data in this memory cell. In contrast, essentially no electrons are injected into the floating gate of each memory cell not selected for data write in the column of the bit line BLn+1 whose channel potential is raised to the write inhibit voltage. Hence, "1" data by which the threshold value is kept negative is written in this memory cell.

A channel boot ratio Cr in the NAND EEPROM of the second embodiment is given by $$Cr=(Ccell+Cas)/[(Ccell+Cas)+Cch]$$

where Ccell is the gate-channel capacitance of all memory cells in the NAND cell between the selector gate transistor near the bit line BLn+1 and the selector gate transistor near the source line SL, Cas is the total capacitance between the gates and the extracting electrode in this NAND cell, and Cch is the sum of the total depletion layer capacitance and junction capacitance of the channels and n-type diffusion layers in the NAND cell. On the other hand, a channel boot ratio Cr' in a common self-boost write when no extracting electrode is formed is $$Cr'=Ccell/(Ccell+Cch)$$

This indicates that in the NAND EEPROM of the second embodiment in which the extracting electrode is formed as described above, the channel boot ratio Cr is increased, so the channel potential of a memory cell not selected for data write in the column of the bit line BLn+1 can be booted to a sufficiently high write inhibit voltage.

A method of fabricating the NAND EEPROM of the second embodiment will be described below. FIGS. 21A to 21D are longitudinal sectional views showing the steps of the method of fabricating the NAND EEPROM of the second embodiment.

Figure 21A:
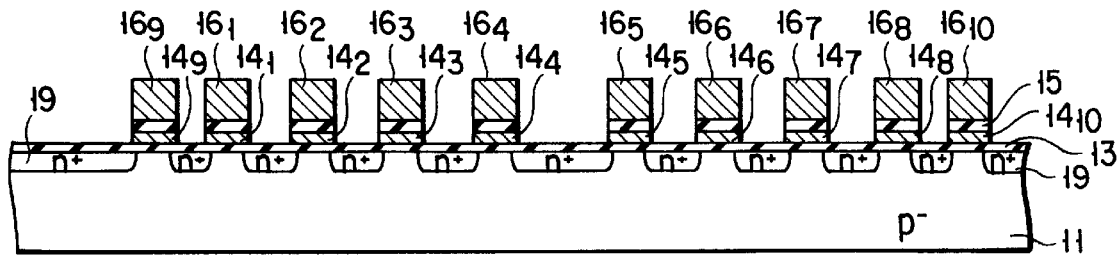
FIGS. 21A, 21B, 21C and 21D are longitudinal sectional views showing the steps of a method of fabricating the NAND EEPROM of the second embodiment.

The steps up to the formation of n-type diffusion layers 19 serving as the source and drain regions of memory cell transistors or MOS transistors of a peripheral circuit are performed following the same procedure as in the method of fabricating the NAND EEPROM of the first embodiment except that both film thicknesses of a second polysilicon layer and a high-melting metal silicide film serving as control gates 16 are, for example, 200 nm. The result is a structure shown in FIG. 21A. FIG. 21A corresponds to FIG. 15A in the method of fabricating the NAND EEPROM of the first embodiment.

Figure 21B:
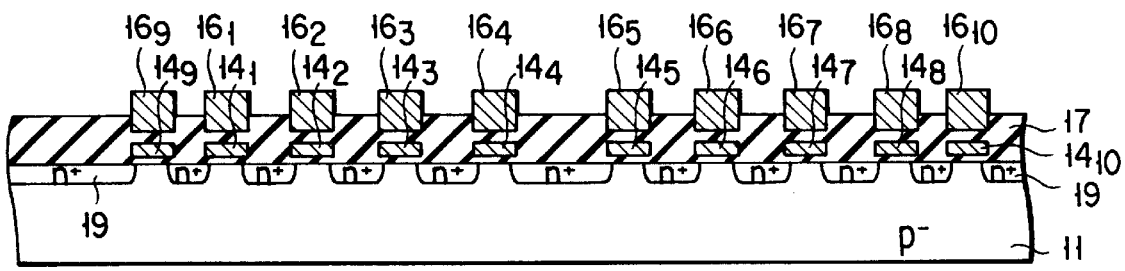

Next, about 800-nm thick BPSG film is deposited as a first insulating interlayer 17 on the entire substrate surface by CVD or the like. This first insulating interlayer 17 is planarized by CMP (Chemical Mechanical Polishing) to expose the upper surfaces of the control gates 16 in the stacked gate structures. Additionally, the first insulating interlayer 17 is etched back by a thickness of about 300 nm by RIE or the like to expose portions of the side surfaces of the control gates 16 as shown in FIG. 21B. It is also possible to omit the planarization by CMP and expose the upper and side surfaces of the control gates 16 by RIE immediately after the first insulating interlayer 17 is formed. The side surfaces of the control gates 16 can also be entirely exposed.

Figure 21C:
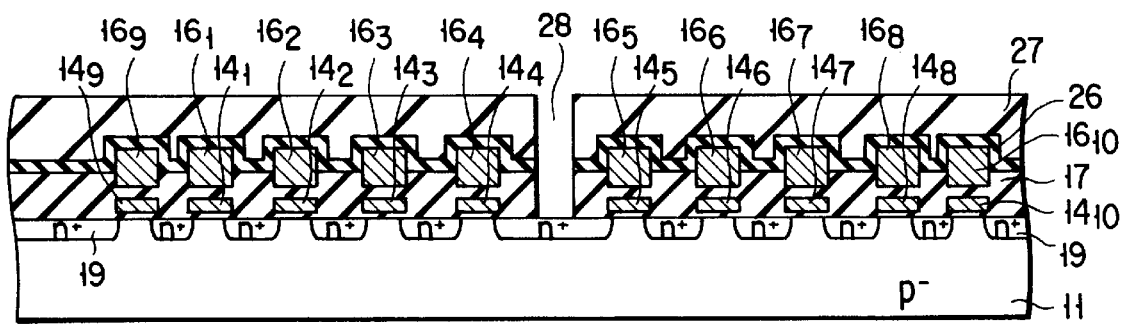

Subsequently, the exposed surfaces of the control gates 16 are cleaned, and a 30-nm thick TEOS film is deposited as a dielectric film 26 on the control gates 16 and the first insulating interlayer 17. As the dielectric film 26, it is also possible to use, e.g., a silicon nitride film and ONO film having a high dielectric constant in addition to a TEOS film. After that, a resist pattern 27 as shown in FIG. 21C is formed by photolithography and used as a mask to form a contact hole 28 for a contact portion of the extracting electrode 20 in a portion above a desired n-type diffusion layer 19.

Figure 21D:
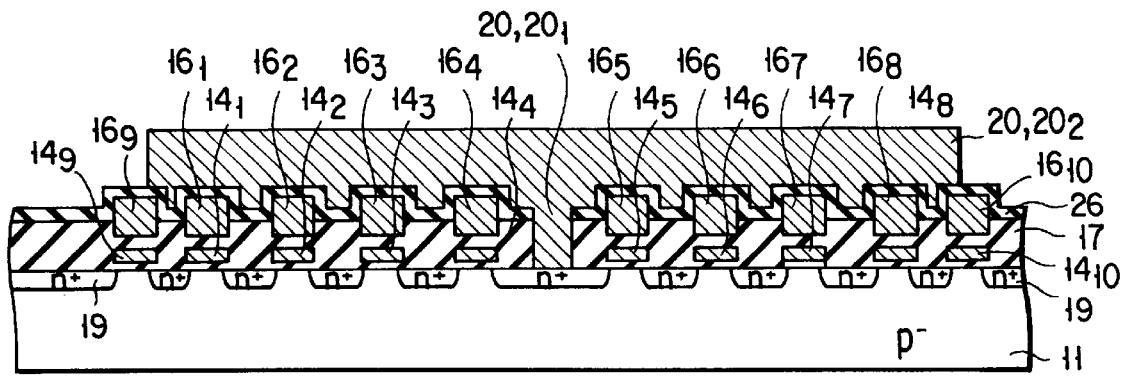

After the resist pattern 27 is removed, as shown in FIG. 21D, a conductive polysilicon layer doped with about $1 \times 10^{20}$ to $4 \times 10^{20}$ cm$^{-3}$ of P or the like and serving as the extracting electrode 20 is deposited by CVD or the like. The conductive polysilicon layer is etched by photolithography into a pattern corresponding to the planar pattern of a NAND cell, thereby forming the extracting electrode 20. If the dielectric film 26 between the extracting electrodes 20 adjacent to each other in the row direction is entirely removed, the control gates 16 below the dielectric film 26 is etched. Therefore, the film thickness of the conductive polysilicon film is so set that the dielectric film 26 remains even between the extracting electrodes 20.

Subsequently, although not shown, a second insulating interlayer 23 such as a silicon oxide film or BPSG film is deposited on the entire substrate surface by CVD or the like. In this second insulating interlayer 23, a contact hole for a bit line contact is formed above an n-type diffusion layer 19 near the drain at one end of the NAND cell. A bit line 18 to be electrically connected to the n-type diffusion layer 19 is formed through this contact hole. More specifically, a plug made from W or the like is buried in the contact hole and planarized, and Al deposited on the second insulating interlayer is patterned into the form of an interconnection in the column direction. In this manner the NAND EEPROM as shown in FIGS. 16 to 18C is fabricated. Note that in this NAND EEPROM of the second embodiment, as in the NAND EEPROM of the first embodiment, an n-type impurity is doped to a portion below the bottom surface of the contact hole 28 for a contact portion of the extracting electrode 20 or the contact hole for bit line contact by ion implantation or solid-phase diffusion from the plug.

In the NAND EEPROM of the second embodiment as described above, the channel potential of a memory cell in which "1" data is to be written can be raised to a sufficiently high write inhibit voltage by using the capacitive coupling between the extracting electrode contacting the n-type diffusion layer in the NAND cell and the counter electrode. Accordingly, it is possible to suppress variations in the threshold value of a memory cell in which "1" data is to be written and thereby avoid degradation of the memory cell write error characteristics in the self-boost write method. For this reason, when data write is performed a sufficiently high write inhibit voltage can be obtained in a memory cell in which "1" data is to be written without excessively raising the intermediate voltage Vpass of a non-selected word line in a selected block. As a consequence, write errors can be effectively prevented even in memory cells connected to a non-selected word line near a NAND cell to the channel of which 0V is transferred from a bit line.

Additionally, no potential is supplied to the extracting electrode in this NAND EEPROM of the second embodiment. Unlike when the conventional booster plate electrode is used, therefore, no additional terminal is necessary, and this is very advantageous for circuit design. Also, the extracting electrode need only contact at least one n-type diffusion layer in a NAND cell, i.e., it is unnecessary to bury booster plate electrodes between all adjacent memory cells in a NAND cell. This does not interfere with the shrinkage of a memory cell array.

Furthermore, as described above, the channel boot ratio Cr in the NAND EEPROM of the second embodiment is represented by $$Cr=(Ccell+Cas)/[(Ccell+Cas)+Cch]$$

This shows that as the total capacitance Cas between the gate and the extracting electrode in a NAND cell increases, the channel potential of the NAND cell rises to yield a higher write inhibit voltage. FIG. 22 shows a partially cutaway perspective view showing the contact portion $20_2$ of the extracting electrode 20 shown in FIGS. 16 to 18C. Cas in the above equation can be approximated to $$Cas=\epsilon 0 \cdot \epsilon s \cdot W(L+2H)N/d$$

(where $\epsilon 0$ is the dielectric constant in vacuum, $\epsilon s$ is the relative dielectric constant of the dielectric film 26, W is the width in the row direction of the extracting portion $20_2$ of the extracting electrode 20, L is the line width (length in the channel lengthwise direction) of the control gate 16, H is the height of the side surface of the control gate 16 which is essentially capacitively coupled with the extracting electrode 20, N is the number of memory cells in one NAND cell, and d is the film thickness of the dielectric film 26.)

Accordingly, as the memory cell array shrinks in feature size, W and L in the above equation are decreased in accordance with the design rule. This decreases the gate-channel capacitance Ccell of all memory cells in the NAND cell and the sum Cch of the depletion layer capacitance and junction capacitance of the channels and n-type diffusion layers in a NAND cell, as the parameters of the channel boot ratio Cr. In contrast, the parameter Cas can be increased by increasing H. That is, in the NAND EEPROM of the second embodiment, the gate side surfaces of memory cells are capacitively coupled with the extracting electrode. This is very effective in sufficiently raising the write inhibit voltage to prevent write errors if memory cell arrays continue to shrink in the future.

The present invention is not limited to the NAND EEPROMs explained in the first and second embodiments. For example, the present invention is preferably applicable to a multi-valued memory in which multi-valued data is stored in each memory cell. FIG. 23 shows the threshold value distribution of memory cells in a multi-valued EEPROM.

In a multi-valued memory cell, the threshold values of "2" and "3" data shown in FIG. 23 are set to be higher than that of "0" data in a binary memory cell. When a write is performed, therefore, a memory cell in which "0" or "1" data having a low threshold value is written large stress to easily cause write error. Hence, the present invention capable of greatly raising the write inhibit voltage to effectively prevent write errors is also very useful to realize a multi-valued memory. As described above, the present invention can be modified without departing from the gist of the invention.

Although the power-supply voltage Vcc is used in the above embodiments, a voltage obtained by lowering the power-supply voltage Vcc can also be used.

As has been described in detail above, the present invention can provide a nonvolatile semiconductor memory device capable of obtaining a sufficiently high write inhibit voltage and widening the write error margin and also suited to further shrinkage of memory cells. Hence, the present invention has a large industrial value.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
    an electrically rewritable memory cell having a gate, source, drain, and charge storage layer; and
    an extracting electrode directly connected to at least one of the source and drain of said memory cell and capacitively coupled with the gate.

2. A nonvolatile semiconductor memory device comprising:
    an electrically rewritable memory cell having a gate, source, drain, and charge storage layer;
    an extracting electrode directly connected to at least one of the source and drain of said memory cell and capacitively coupled with the gate; and
    a counter electrode substantially capacitively coupled with said extracting electrode.

3. A nonvolatile semiconductor memory device comprising:
    a cell unit in which a plurality of electrically rewritable memory cells each having a gate, source, drain, and charge storage layer are connected to make adjacent memory cells share one of their sources and one of their drains;
    an extracting electrode directly contacting at least one of the source and drain in said cell unit and capacitively coupled with the gate; and
    a counter electrode substantially capacitively coupled with said extracting electrode.

4. A device according to claim 3, further comprising:
    a bit line connected to one of a drain and source at one end of said cell unit; and
    a source line connected to one of a source and drain at the other end of said cell unit.

5. A device according to claim 4, wherein said cell unit comprises a first selector gate transistor formed at one end connected to the bit line and a second selector gate transistor formed at the other end connected to the source line.

6. A device according to claim 5, wherein said memory cell is selected for data write when a first voltage which switches on said first selector gate transistor is applied to said bit line while said second selector gate transistor is kept OFF, and is not selected for data write when a second voltage which switches off said first selector gate transistor is applied to said bit line while said second selector gate transistor is kept OFF.

7. A device according to claim 6, wherein data is simultaneously written in memory cells sharing a word line.

8. A device according to claim 3, wherein a plurality of said cell units are integrated in a matrix manner to form a memory cell array, and said extracting electrode is formed in each cell unit.

9. A device according to claim 3, wherein said counter electrode is shared by a plurality of cell units sharing word lines.

10. A device according to claim 3, wherein upper and side surfaces of the gate of said memory cell are covered with an insulating film having different etching selectivity from etching selectivity of an insulating interlayer deposited on said memory cell, and a contact portion of said extracting electrode which contacts at least one of the source and drain is formed in self-alignment with the gate of said memory cell.

11. A device according to claim 3, wherein said extracting electrode has a contact portion contacting at least one of the source and drain in said cell unit and an extracting portion extracted to a portion above said memory cell.

12. A device according to claim 3, wherein said cell unit is a NAND cell in which a plurality of memory cells are connected in series to make adjacent memory cells share one of the sources and one of the drains.

13. A nonvolatile semiconductor memory device comprising:
    a cell unit in which a plurality of electrically rewritable memory cells each having a gate, source, drain, and charge storage layer are connected to make adjacent memory cells share one of the sources and one of the drains; and
    an extracting electrode directly contacting at least one of the source and drain in said cell unit and capacitively coupled with the gate.

14. A device according to claim 13, further comprising:
    a bit line connected to one of a drain and source at one end of said cell unit; and
    a source line connected to one of a source and drain at the other end of said cell unit.

15. A device according to claim 14, wherein said cell unit comprises a first selector gate transistor formed at one end connected to the bit line and a second selector gate transistor formed at the other end connected to the source line.

16. A device according to claim 15, wherein said memory cell is selected for data write when a first voltage which switches on said first selector gate transistor is applied to said bit line while said second selector gate transistor is kept OFF, and is not selected for data write when a second voltage which switches off said first selector gate transistor is applied to said bit line while said second selector gate transistor is kept OFF.

17. A device according to claim 16, wherein data is simultaneously written in memory cells sharing a word line.

18. A device according to claim 13, wherein said extracting electrode is substantially capacitively coupled with upper and side surfaces of the gate.

19. A device according to claim 13, wherein said extracting electrode has a contact portion contacting at least one of the source and drain in said cell unit and an extracting portion extracted to a portion above said memory cell.

20. A device according to claim 13, wherein said cell unit is a NAND cell in which a plurality of memory cells are connected in series to make adjacent memory cells share one of the sources and one of the drains.

21. A nonvolatile semiconductor memory device comprising:

a plurality of cell units which are integrated in a matrix manner to form a memory cell array, wherein each of the plurality of cell units has a plurality of electrically rewritable memory cells, each having a gate, source, drain, and charge storage layer, connected to make adjacent memory cells share one of the sources and one of the drains; and an extracting electrode directly contacting at least one of the source and drain in said cell unit capacitively coupled with the gate, wherein said extracting electrode is formed in each cell unit.

22. A device according to claim 21, wherein said extracting electrode opposes upper surfaces of the gates of all memory cells in said cell unit via an insulating film.

* * * * *